United States Patent
Gareau et al.

(10) Patent No.: US 10,382,167 B2
(45) Date of Patent: Aug. 13, 2019

(54) FLEXIBLE ETHERNET ENHANCED FORWARD ERROR CORRECTION

(71) Applicant: Ciena Corporation, Hanover, MD (US)

(72) Inventors: Sebastien Gareau, Ottawa (CA); Eric S. Maniloff, Stittsville (CA)

(73) Assignee: Ciena Corporation, Hanover, MD (US)

( * ) Notice: Subject to any disclaimer, the term of this patent is extended or adjusted under 35 U.S.C. 154(b) by 35 days.

(21) Appl. No.: 15/377,002

(22) Filed: Dec. 13, 2016

(65) Prior Publication Data

US 2018/0167160 A1    Jun. 14, 2018

(51) Int. Cl.
*H04L 1/00* (2006.01)
*H03M 13/00* (2006.01)
(Continued)

(52) U.S. Cl.
CPC ........ *H04L 1/007* (2013.01); *H03M 13/6522* (2013.01); *H04L 1/0041* (2013.01);
(Continued)

(58) Field of Classification Search
CPC ...... H04J 2203/0089; H04J 2203/0085; H04Q 11/0067; H04Q 2011/0064; H04L 1/007; H04L 12/413; H04L 1/0041; H04L 49/351; H04L 1/0083; H04L 41/00; H04L 1/0058; H04L 69/14; H04L 2001/0096; H03M 13/6522
(Continued)

(56) References Cited

U.S. PATENT DOCUMENTS 7,567,581 B2 *   7/2009   Patenaude ............... H04J 3/1611
                                                         370/419
8,547,864 B2 *  10/2013   Fourcand ............ H04L 43/0864
                                                         370/252
(Continued)

FOREIGN PATENT DOCUMENTS

EP          2509243 A1    10/2012

OTHER PUBLICATIONS

"FlexE Implementation Agreement—Draft 1.1," Optical Internetworking Forum, Jul. 2015.
(Continued)

*Primary Examiner* — James C Kerveros
(74) *Attorney, Agent, or Firm* — Clements Bernard Walker PLLC; Christopher L. Bernard; Lawrence A. Baratta

(57) ABSTRACT

Flexible Ethernet (FlexE) Forward Error Correction (FEC) systems and methods include mapping a first set of calendar slots including Ethernet payload clients to a FlexE Time Division Multiplexing (TDM) structure including a plurality of calendar slots; and mapping a second set of calendar slots including FEC data to the FlexE TDM structure, wherein the first set of calendar slots and the second set of calendar slots fill the FlexE TDM structure. In an exemplary embodiment, an overall Physical (PHY) rate of the FlexE TDM structure is kept constant with a reduction in bandwidth for the Ethernet payload clients based on the second set. In another exemplary embodiment, the overall Physical (PHY) rate of the FlexE TDM structure is increased based on the second set of calendar slots, to support a set rate for the Ethernet payload clients with a reduced number of calendar slots.

20 Claims, 14 Drawing Sheets

(51) Int. Cl.
    H04L 12/24      (2006.01)
    H04L 29/06      (2006.01)
    H04Q 11/00      (2006.01)
    H04L 12/413     (2006.01)
    H04L 12/931     (2013.01)
(52) U.S. Cl.
    CPC .......... *H04L 1/0058* (2013.01); *H04L 1/0083* (2013.01); *H04L 12/413* (2013.01); *H04L 41/00* (2013.01); *H04L 49/351* (2013.01); *H04J 2203/0085* (2013.01); *H04J 2203/0089* (2013.01); *H04L 69/14* (2013.01); *H04L 2001/0096* (2013.01); *H04Q 11/0067* (2013.01); *H04Q 2011/0064* (2013.01)
(58) Field of Classification Search
    USPC ........................................................ 714/776
    See application file for complete search history.

(56) References Cited

U.S. PATENT DOCUMENTS

| | | | |
|---|---|---|---|
| 8,867,913 | B2 | 10/2014 | Gareau et al. |
| 9,231,721 | B1 | 1/2016 | Varadarajan et al. |
| 2005/0102419 | A1 | 5/2005 | Popescu et al. |
| 2008/0095535 | A1* | 4/2008 | Zou .................... H04Q 11/0067 398/58 |
| 2010/0189433 | A1* | 7/2010 | Trojer ................ H04Q 11/0067 398/8 |
| 2012/0099854 | A1* | 4/2012 | Fourcand ............ H04L 43/0858 398/25 |
| 2012/0121265 | A1* | 5/2012 | Suvakovic ........... H04B 10/272 398/66 |
| 2012/0134674 | A1* | 5/2012 | Shin .................... H04J 3/0623 398/58 |
| 2013/0266312 | A1 | 10/2013 | Prakash et al. |
| 2013/0308943 | A1 | 11/2013 | Young et al. |
| 2014/0122978 | A1 | 5/2014 | Kubo |
| 2015/0003470 | A1* | 1/2015 | Danielsson ............... H04J 3/06 370/458 |
| 2015/0055664 | A1 | 2/2015 | Kanonakis et al. |
| 2017/0244648 | A1* | 8/2017 | Tse ......................... H04L 47/801 |
| 2018/0013511 | A1* | 1/2018 | Hussain ............... H04J 14/0204 |
| 2018/0159785 | A1* | 6/2018 | Wu ........................... H04L 1/00 |

OTHER PUBLICATIONS

"Architecture of Ethernet layer networks," International Telecommunication Union, Feb. 2004.
"FlexE Implementation Agreement OIF-FLEXE-01.0" Optical Internetworking Forum, Mar. 2016.
May 23, 2018, International Search Report issued for International Application No. PCT/US2017/064619.
OIF, Optical Internetworking Forum, IA OIF-FLEXE-01.1, FELX Ethernet Implementation Agreement, Mar. 1, 2016, pp. 1-31.
Mar. 26, 2018, Partial International Search Report issued for International Application No. PCT/US2017/064619.
OIF, Optical Internetworking Forum, IA OIF-FLEXE-01.1, FELX Ethernet Implementation Agreement, Jun. 21, 2017, Fremon, CA, pp. 1-35.
M. Gustlin and F. Dada. What is FlexEthernet? Ethernet Technology Summit, Apr. 2015. http://www.ethernetsummit.com/English/Collaterals/Proceedings/2015/20150415_1C_Gustlin.pd.
"FlexEthernet (FlexE) Use Cases,". Ethernet Alliance TEF, The Rate Debate, 2014, http://www.ethernetalliance.org/.
Gustlin, "FlexEthernet—Protocols and Components," XILINX All Programmable, Oct. 16, 2014.
Aug. 6, 2018 European Search Report issued for International Application No. EP18176943.
Stephen J. Trowbridge, Alcatel-Lucent USA, Mapping, of Flex Ethernet Clients over OTN, International Telecommunication Union, COM 15-C 1213-E, Study Period 2013-2016, vol. 11/15, Jun. 2015, pp. 1-7.

* cited by examiner

FLEXIBLE ETHERNET ENHANCED FORWARD ERROR CORRECTION

FIELD OF THE DISCLOSURE

The present disclosure generally relates to networking systems and methods. More particularly, the present disclosure relates to Flexible Ethernet (FlexE) enhanced Forward Error Correction (FEC).

BACKGROUND OF THE DISCLOSURE

Layer 1 protocols and technologies have evolved including Synchronous Optical Network (SONET)/Synchronous Digital Hierarchy (SDH) in the 1990s to Optical Transport Network (OTN) in the 2000s. SONET/SDH were synchronous protocols optimized for circuit switching and transmission. OTN evolved from SONET/SDH to provide transparency and support for Wavelength Division Multiplexing (WDM) as well as for optimized transmission of packet traffic. SONET, SDH, and OTN each have a rich suite of Operations, Administration, and Maintenance (OAM) functions and support for a wide range of services and applications. Conventionally, as OTN scales beyond 100 G (B100 G), there are emerging frameworks for Layer 1 functionality, namely Flexible OTN (FlexO or B100 G) initiatives in the International Telecommunication Union (ITU) and Flex Ethernet in the Optical Internetworking Forum (OIF).

Traditionally, Ethernet rates were defined in steps of 10×, i.e., 10 Mb/s, 100 Mb/s, 1 Gb/s (GbE), etc. There is a wrinkle in this 10× progression where 40 Gb/s Ethernet (40 GbE) was defined. Today, there are various Ethernet rates defined, including rates in-between established rates. IEEE 802.3 standards group is discussing 2.5 Gb/s, 5 Gb/s, 25 Gb/s and other various odd rates. Specifically, different rates are established for different applications, such as wireless applications, data center group applications, data center interconnections, etc. There is an expectation that different Ethernet rates will continue as new high-volume applications require optimized solutions. Specifically, router/switch equipment and optical transmission equipment are evolving at different rates. There is a desire to support simple transport of n×Ethernet streams across a faster interface. IEEE historically defines Ethernet rates (Media Access Control (MAC) layer) with projects that also define the Physical (PHY)/Physical Medium Dependent (PMD) rates; the MAC rates and PMD rates are tied and defined together. To address evolution in Ethernet and dissociate the MAC/client rate to the PHY/PMD, Flexible Ethernet has been proposed. Note, as described herein, the terms Flexible Ethernet, Flex Ethernet, and FlexE can be used interchangeably.

In transport applications, FlexE can be used to match the flexibility of optical transmission equipment. Specifically, optical transmission equipment (e.g., Dense Wave Division Multiplexing (DWDM)) is evolving to support variable modulation formats, Forward Error Correction (FEC) schemes, baud rates, etc. DWDM equipment can support a variable line rate with the same hardware, to match the data rate to the link capacity. FlexE is based on Ethernet constructs, e.g., 64 b/66 b encoding, recognizing the primary client being transported is Ethernet. Note, the current scope of FlexE, as described in Implementation Agreement IA #OIF-FLEXE-01.0 "Flex Ethernet Implementation Agreement" (March 2016), the contents of which are incorporated by reference, is limited to interfacing applications (e.g., bonding, subrating, and channelization).

Ethernet interfaces are typically defined for Bit Error Rates (BER) of $10^{-12}$ and these interfaces address optical reaches of about 70 m to 40 km. There is often a requirement for improved BER targets, such as $10^{-15}$, which is more in line to expectations for transport equipment. Ethernet conventionally provides Physical Coding Sublayer (PCS) FEC (e.g., in IEEE 802.3bj, 802.3bs, etc.). However, each time the FEC or reach objective changes, IEEE has to define a new interface, i.e., IEEE 802.3xx. Disadvantageously, new interfaces/specifications impact vendors, operators, and component suppliers.

It would be advantageous to incorporate flexible FEC schemes within existing Ethernet interfaces, avoiding the need for new interface specification and allowing application flexibility.

BRIEF SUMMARY OF THE DISCLOSURE

In an exemplary embodiment, a Flexible Ethernet (FlexE) Forward Error Correction (FEC) method includes mapping a first set of calendar slots including Ethernet payload clients to a FlexE Time Division Multiplexing (TDM) structure including a plurality of calendar slots; and mapping a second set of calendar slots including FEC data to the FlexE TDM structure, wherein the first set of calendar slots and the second set of calendar slots fill the FlexE TDM structure. In an exemplary embodiment, an overall Physical (PHY) rate of the FlexE TDM structure can be kept constant with a reduction in bandwidth for the Ethernet payload clients based on the second set. In another exemplary embodiment, an overall Physical (PHY) rate of the FlexE TDM structure can be increased based on the second set of calendar slots, to support a set rate for the Ethernet payload clients with a reduced number of calendar slots. The FlexE TDM structure can include 20 calendar slots with the first set of calendar slots including N slots and the second set of calendar slots including M slots, N and M are integers and N>M. The mapping steps can be performed in a corresponding switch or framer/mapper, independent of a FlexE client module which transmits and receives the FlexE TDM structure. The FEC data can be utilized iteratively with Physical Coding Sublayer (PCS) FEC at another layer. Each sequence of the plurality of calendar slots can include the first set of calendar slots and the second set of calendar slots. One sequence of the plurality of calendar slots can include only the first set of calendar slots and a subsequent sequence of the plurality of calendar slots includes both the first set of calendar slots and the second set of calendar slots. The second set of calendar slots including the FEC data can be communicated via a calendar and dynamically adjusted based thereon.

In another exemplary embodiment, an apparatus for Flexible Ethernet (FlexE) Forward Error Correction (FEC) includes circuitry adapted to map a first set of calendar slots including Ethernet payload clients to a FlexE Time Division Multiplexing (TDM) structure including a plurality of calendar slots; and circuitry adapted to map a second set of calendar slots including FEC data to the FlexE TDM structure, wherein the first set of calendar slots and the second set of calendar slots fill the FlexE TDM structure. In an exemplary embodiment, an overall Physical (PHY) rate of the FlexE TDM structure can be kept constant with a reduction in bandwidth for the Ethernet payload clients based on the second set. In another exemplary embodiment, an overall Physical (PHY) rate of the FlexE TDM structure can be increased based on the second set of calendar slots to support a set rate for the Ethernet payload clients with a reduced number of calendar slots. The FlexE TDM structure can include 20 calendar slots with the first set of calendar slots including N slots and the second set of calendar slots including M slots, N and M are integers and N>M. The apparatus can be disposed in a corresponding switch or framer/mapper, independent of a FlexE client module which transmits and receives the FlexE TDM structure. The FEC data can be utilized iteratively with Physical Coding Sublayer (PCS) FEC at another layer. Each sequence of the plurality of calendar slots can include the first set of calendar slots and the second set of calendar slots. One sequence of the plurality of calendar slots can include only the first set of calendar slots and a subsequent sequence of the plurality of calendar slots includes both the first set of calendar slots and the second set of calendar slots.

In a further exemplary embodiment, a device which is a switch or framer/mapper using Flexible Ethernet (FlexE) includes an interface to a FlexE client module adapted to transmit and receive a FlexE Time Division Multiplexing (TDM) structure; and mapping circuitry communicatively coupled to the interface and adapted to map a first set of calendar slots including Ethernet payload clients to a FlexE Time Division Multiplexing (TDM) structure including a plurality of calendar slots, and map a second set of calendar slots including Forward Error Correction (FEC) data to the FlexE TDM structure, wherein the first set of calendar slots and the second set of calendar slots fill the FlexE TDM structure. In an exemplary embodiment, an overall Physical (PHY) rate of the FlexE TDM structure can be kept constant with a reduction in bandwidth for the Ethernet payload clients based on the second set. In another exemplary embodiment, an overall Physical (PHY) rate of the FlexE TDM structure can be increased based on the second set of calendar slots to support a set rate for the Ethernet payload clients with a reduced number of calendar slots.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various exemplary embodiments, the present disclosure relates to Flexible Ethernet (FlexE) enhanced Forward Error Correction (FEC). Specifically, the FlexE enhanced FEC uses FlexE calendar slots for FEC information, to extend its reach beyond the relevant standards (e.g., LR 10 km or ER 40 km) and/or to improve its operating BER (bit error rate). To accommodate use of the calendar slots for the FEC information, the systems and methods either adapt the PMD rate or the MAC rate. Advantageously, the enhanced FEC provides improved BER performance for client interfaces and/or extends the reach of standard interfaces beyond the associated specifications. The enhanced FEC can be used with standard Ethernet client modules in various applications including access, mobile front haul, data center interconnection, etc. In an exemplary embodiment, the enhanced FEC can be used to extend the reach between data centers without requiring another protocol (e.g., OTN) to transport FlexE/Ethernet clients.

Flexible Ethernet

FlexE provides a generic mechanism for supporting a variety of Ethernet Media Access Control (MAC) rates that may or may not correspond to any existing Ethernet PHY rate. This includes MAC rates that are both greater than (through bonding) and less than (through sub-rate and channelization) the Ethernet PHY (Physical Layer) rates used to carry FlexE. This can be viewed as a generalization of the Multi-Link Gearbox implementation agreements, removing the restrictions on the number of bonded PHYs (MLG2.0, for example, supports one or two 100GBASE-R PHYs) and the constraint that the client signals correspond to Ethernet rates (MLG2.0 supports only 10 G and 40 G clients). The Multi-Link Gearbox implementation agreements are described in IA # OIF-MLG-01.0 "Multi-link Gearbox Implementation Agreement" (May 2012), IA # OIF-MLG-02.0 "Multi-link Gearbox Implementation Agreement" (April 2013), and IA # OIF-MLG-03.0 "Multi-link Gearbox Implementation Agreement" (April 2016), the contents of each are incorporated by reference.

Figure 1:
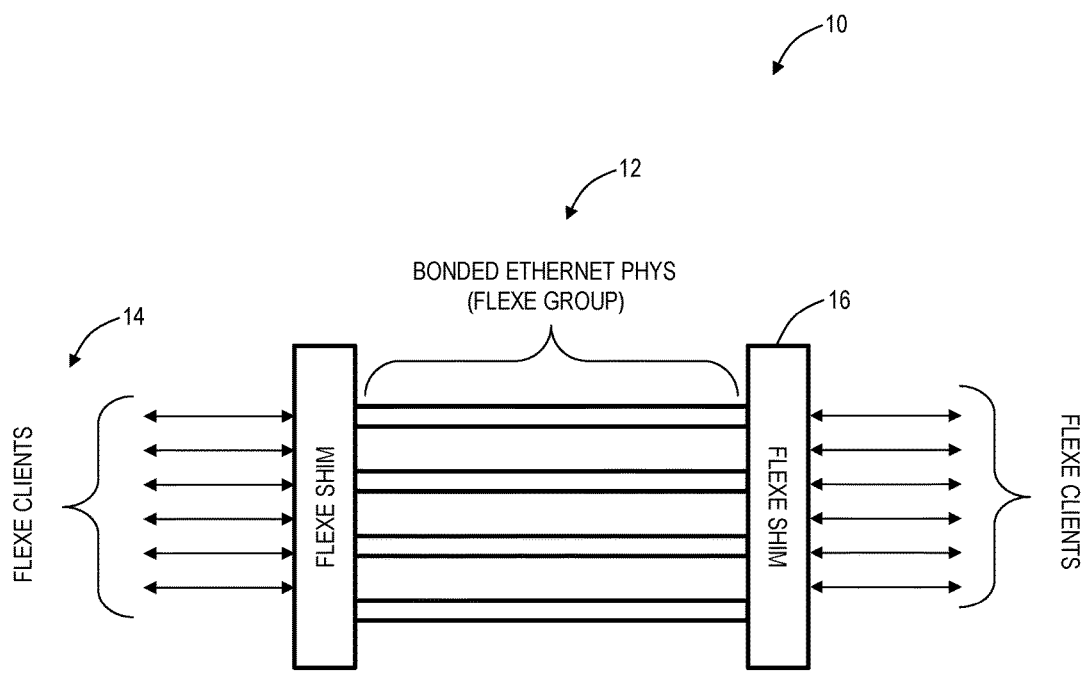
FIG. 1 is a diagram of a general structure of FlexE.

Referring to FIG. 1, in an exemplary embodiment, a diagram illustrates a general structure of FlexE 10. Again, conventionally, the general capabilities supported by the FlexE include (i) bonding of Ethernet PHYs, e.g., supporting a 200 G MAC over two bonded 100GBASE-R PHYs, (ii) sub-rates of Ethernet PHYs, e.g., supporting a 50 G MAC over a 100GBASE-R PHY, and (iii) channelization within a PHY or a group of bonded PHYs, e.g., support a 150 G and two 25 G MACs over two bonded 100GBASE-R PHYs. Note, combinations are also contemplated, for example, a sub-rate of a group of bonded PHYs, for example, a 250 G MAC over three bonded 100GBASE-R PHYs.

The general structure of FlexE 10 includes a FlexE group 12, one or more FlexE clients 14, and a FlexE shim 16. The FlexE group 12 refers to a group including 1 to n bonded Ethernet PHYs. The FlexE group 12 can include one or more bonded 100GBASE-R PHYs as well as including other rates, including new, higher rates once those standards are complete. The one or more FlexE clients 14 are each an Ethernet flow based on a MAC data rate that may or may not correspond to any Ethernet PHY rate. The FlexE client 14

MAC rates supported by the current implementation agreement (IA #OIF-FLEXE-01.0) are 10, 40, and m×25 Gb/s. The FlexE shim 16 is the layer that maps or demaps the FlexE clients 14 carried over the FlexE group 12. Similar to the terminology of MLG, a FlexE mux refers to the transmit direction which maps the FlexE clients 14 over the FlexE group 12. The FlexE demux refers to the receive direction which demaps the FlexE clients 14 from the FlexE group 12.

Figure 2A:
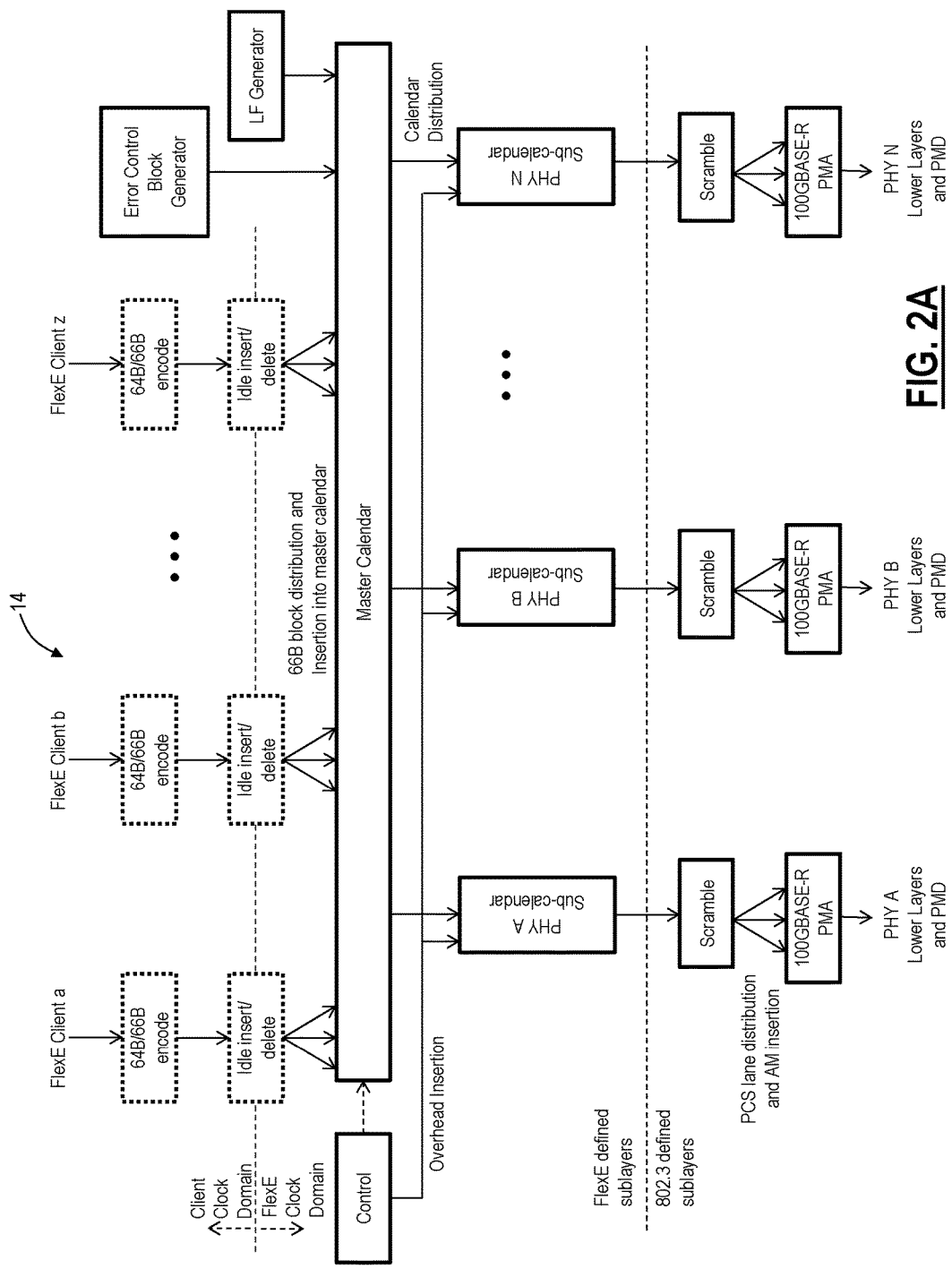
FIG. 2A is a block diagram of FlexE mux functions.
Figure 2B:
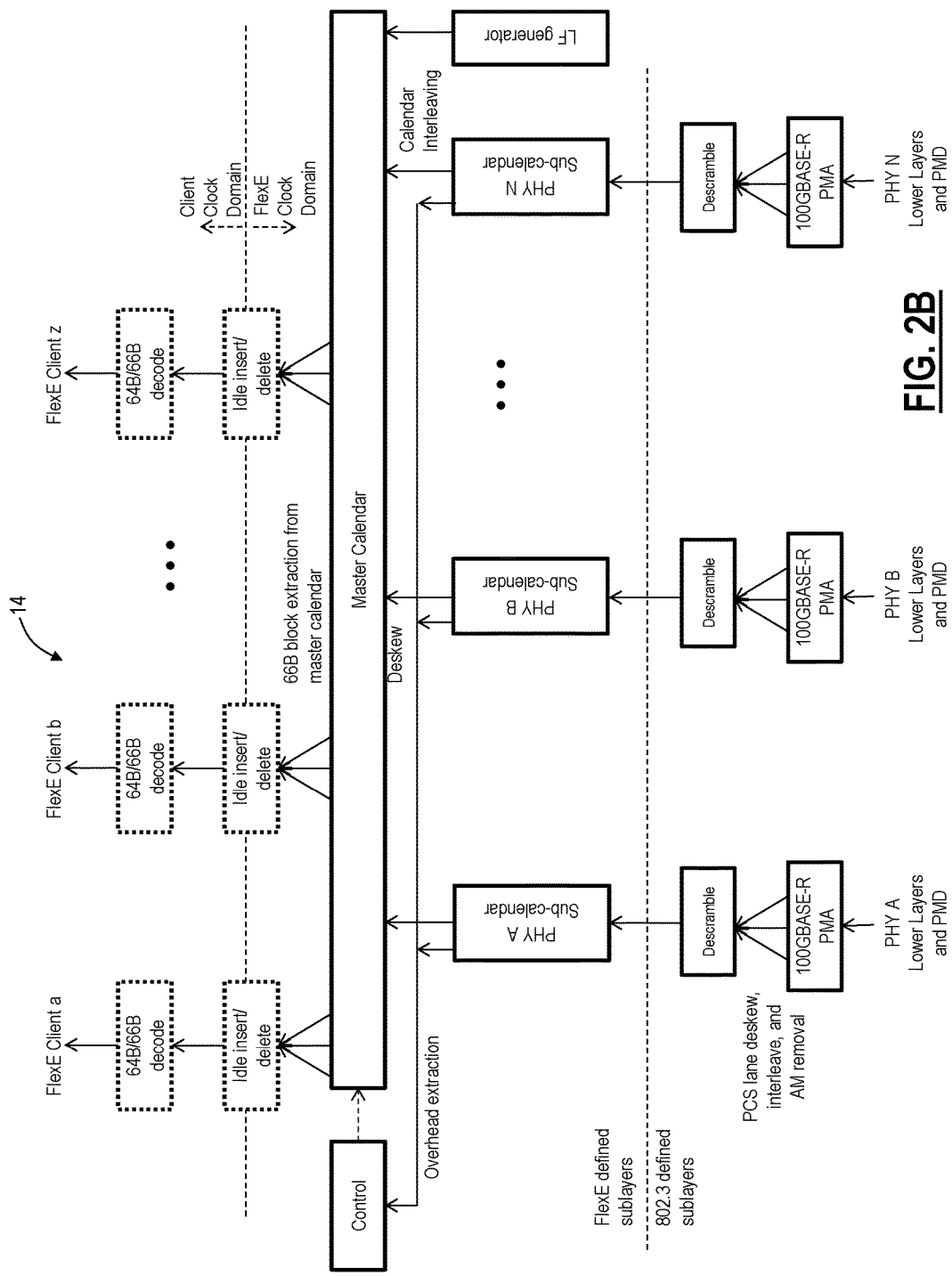
FIG. 2B is a block diagram of FlexE demux functions.

Referring to FIGS. 2A and 2B, in an exemplary embodiment, block diagrams illustrate FlexE mux functions (FIG. 2A) and FlexE demux functions (FIG. 2B). The FlexE shim 16 can be envisioned as being in the middle of the Physical Coding Sublayer (PCS) in the 100GBASE-R stack as illustrated in IEEE Std 802.3-2015 Figure 80-1. The Media Independent Interface (MII), Reconciliation Sublayer (RS), and MAC above the FlexE shim 16 are separate for each FlexE client 14 and operate at the FlexE client rate. The layers below the PCS (100GBASE-R Physical Medium Attachment (PMA), optional FEC, PMD) are used intact as specified for Ethernet. IEEE 802.3 is a working group, and a collection of IEEE standards produced by the working group defining the physical layer and data link layer's MAC of wired Ethernet.

FIG. 2A illustrates the functions of the FlexE mux (the FlexE shim 16 functions in the transmit direction). Where the 64 b/66 b encode and idle insert/delete functions are performed and whether these functions are part of the FlexE mux is application specific. What is presented for insertion into the slots of the FlexE master calendar is a stream of 64 b/66 b encoded blocks from each client encoded per IEEE Std 802.3-2015 Table 82-4 which has been rate-matched to other clients of the same FlexE shim 16. This stream of 66 b blocks might be created directly at the required rate using back-pressure from a Network Processing Unit (NPU). It might come from a single-lane Ethernet PHY such as 10 G or 25 G, where the process of rate-matching involves both idle insertion/deletion, plus converting the rate-aligned stream from the 4-byte alignment of IEEE Std 802.3-2015 clause 49 to the 8-byte alignment of IEEE Std 802.3-2015 clause 82. Note that the IEEE 802.3 diagrammatic convention of showing idle insertion/deletion as though this were an operation that operates on a stream of 64 b/66 b blocks, even though strictly speaking this may require 64 b/66 b decoding and recoding, particularly in the case of converting between 4-byte alignment and 8-byte alignment. The stream of blocks may come from a multi-lane Ethernet PHY, where the lanes need to be deskewed and re-interleaved with alignment markers removed prior to performing idle insertion/deletion to rate match with other clients of the same FlexE shim 16. Or the stream may have come from another FlexE shim 16, for example, connected across an OTN network, where all that is required is to perform idle insertion/deletion to rate match with other clients of the same FlexE shim 16.

The 66 b blocks from each FlexE client 14 are distributed sequentially into the master calendar in the order described herein. The 66 b blocks from the master calendar are distributed to each PHY of the FlexE group 12 according to the ordering described herein. The FlexE overhead is inserted into the sub-calendar of each PHY. The stream of 66 b blocks of each PHY is distributed to the PCS lanes of that PHY with the insertion of alignment markers, and this is presented at the PMA service interface in the 100GBASE-R stack. Lower layers and interfaces of the 100GBASE-R Ethernet PHY (e.g., CAUI, FEC, PMA, PMD) are used as specified in IEEE Std 802.3-2015. Error Control blocks are generated for insertion into calendar slots that are unused or unavailable. LF (Local Fault) blocks are generated for insertion into the calendar slots of any failed FlexE client.

FIG. 2B illustrates the functions of the FlexE demux (the FlexE shim 16 in the receive direction). The layers of each 100GBASE_R PHYs below the PCS are used exactly as specified in IEEE Std 802.3-2012. The PCS lanes are recovered, deskewed, reinterleaved, and the alignment markers are removed. The aggregate stream is descrambled. The calendar slots of the each PHY are logically interleaved in the order specified herein. The FlexE overhead is recovered from each PHY. In the case that any PHY of the FlexE group 12 has failed (PCS_Status=FALSE) or overhead lock or calendar lock has not been achieved on the overhead of any of the PHYs, LF is generated to be demapped from the master calendar for each FlexE PHY. The 66 b blocks are extracted from the master calendar positions assigned to each FlexE client in the order described herein.

Where the Idle Insertion/Deletion, 66 B Decoding functions are performed and whether they are inside or outside the FlexE is application specific. The 66 b blocks could be delivered directly to an NPU. If delivered to a single-lane PHY, idle insertion/deletion may be used to increase the rate to the PHY rate, realigning to 4-byte boundaries in the process (for 10 G or 25 G) and recoding 64 b/66 b according to clause 49. For a multi-lane PHY, idle insertion/deletion is used to increase the rate to the PHY rate less the space needed for alignment markers; the blocks are distributed to PCS lanes with AM insertion. For a FlexE client mapped over OTN, idle insertion/deletion may be used to adjust the rate as required for the OTN mapping.

FlexE Applications

FlexE can support a variety of applications. A non-exhaustive list includes:

Router to Transport Connection.

Intra-Data Center "Fat Pipe" application: bonded PHYs for flows exceeding the PHY rate, or carrying traffic that doesn't distribute efficiently with LAG.

Generalized MLG for port expansion applications, e.g., an n×100 G PHY as an umbilicus to a satellite shelf of lower rate ports.

Figure 3:
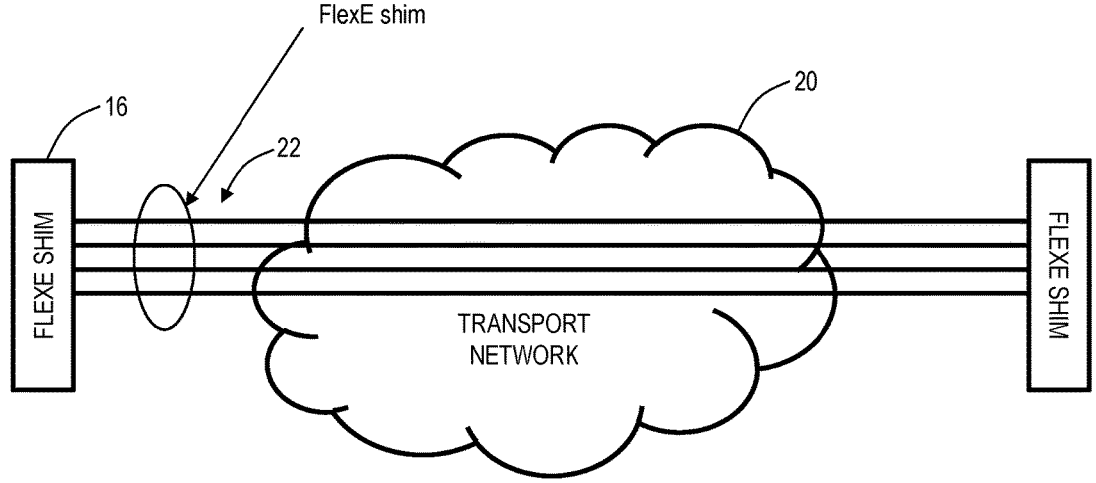
FIG. 3 is a diagram of a transport network aware or unaware of a router to transport FlexE connection.

Referring to FIG. 3, in an exemplary embodiment, a network diagram illustrates a transport network 20 unaware of a router to transport FlexE connection. In FIG. 3, the FlexE shim 16, e.g., in a router or switch, maps the FlexE client(s) 14 over a group of bonded Ethernet PHYs 22. Each of the Ethernet PHYs 22 is carried independently over the transport network 20 using a PCS codeword transparent mapping (e.g., the mapping of 100GBASE-R into Optical channel Path Unit 4 (OPU4) as described in ITU-T Recommendation G.709 clause 17.7.5). The Ethernet PHYs 22 are intended to be carried over the same fiber route. All of the PHYs 22 of the FlexE group 12 need to be interconnected between the same two FlexE shims 16. In this case, the FlexE shim 16 will need to tolerate and accommodate considerably more skew than if the FlexE shims 16 were only separated by an Ethernet link distance of 40 km or less, as the transport network 20 could carry the signal over thousands of kilometers. Alternatively skew can be managed in the transport network to avoid adding additional skew requirements to the FlexE shim. For the case illustrated in FIG. 3, it is the PHYs 22 of the FlexE group 12 which are carried over the transport network 20. Note, in FIG. 3, the transport network 20 is unaware of FlexE 10.

Figure 4:
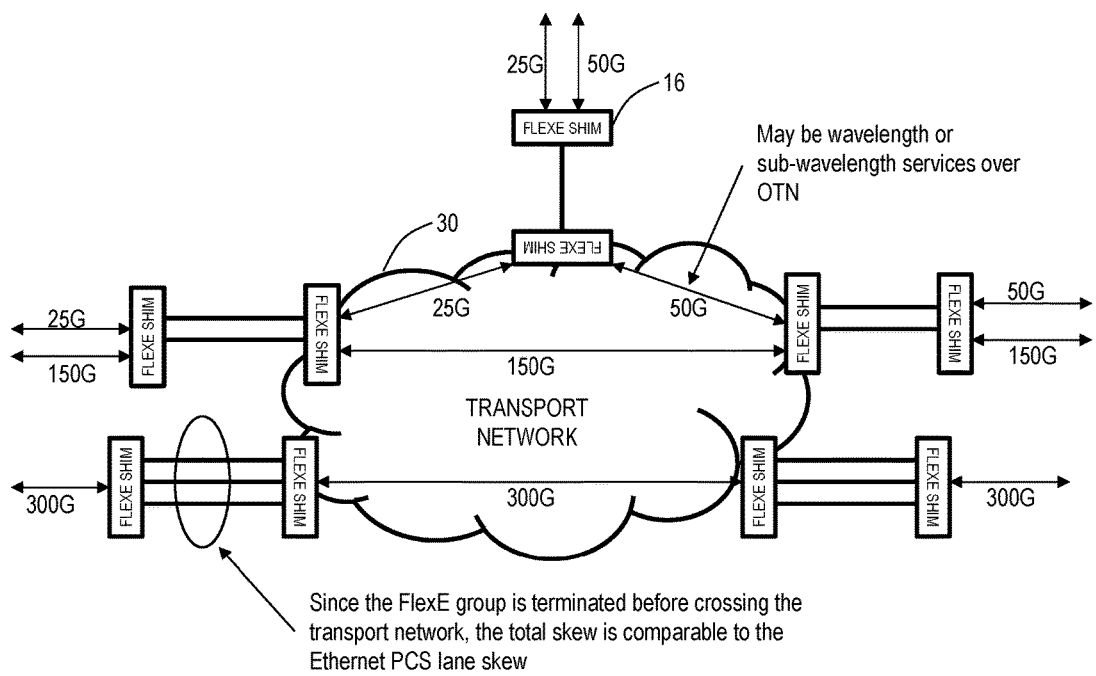
FIG. 4 is a network diagram of a transport network aware and terminating FlexE.

Referring to FIG. 4, in an exemplary embodiment, a network diagram illustrates a transport network 30 aware of FlexE. In FIG. 4, the distance between any pair of FlexE shims 16 is limited to the Ethernet link distance (about 40 km maximum), so the amount of skew that needs to be tolerated and compensated is considerably less. The other important distinction here is that it is the FlexE clients 14 rather than the PHYs 22 of the FlexE group 12 which are carried over the transport network 30. The FlexE client 14 could be constructed to be the complete size of the payload that can be carried over a single wavelength (e.g., construct 200 G to fill a Dual Polarization (DP) 16-Quadrature Amplitude Modulation (16QAM) wavelength with the bonding of two 100GBASE-R PHYs), or could be a smaller client which is multiplexed and switched at a sub-wavelength level, using the mapping described in ITU-T Recommendation G.709 clause 17.9 to carry the FlexE client signal over an Optical channel Data Unit flex (ODUflex) Constant Bit Rate (CBR).

Figure 5:
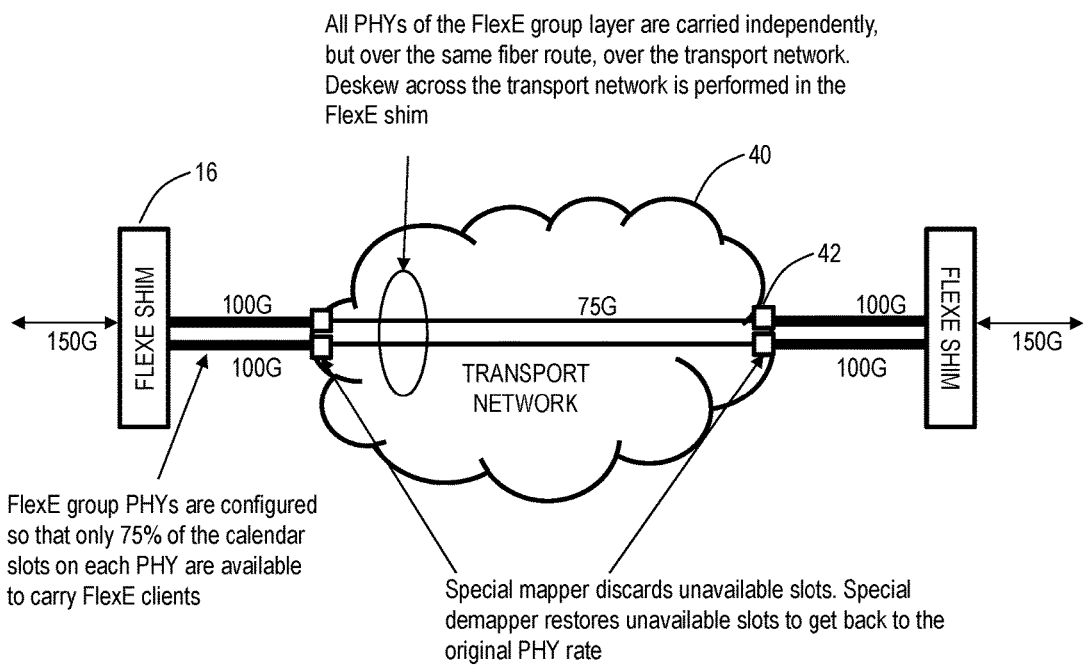
FIG. 5 is a network diagram of a transport network example for partial-rate transport of Ethernet PHYs of a FlexE group.

Referring to FIG. 5, in an exemplary embodiment, a network diagram illustrates a transport network 40 of an example of partial-rate transport of Ethernet PHYs 22 of a FlexE group 12. Here, the Ethernet PHY rate may be greater than the wavelength rate, and there is a reason (for example, wavelengths terminated on different line cards) that it is not desirable to terminate the FlexE shim 16 in transport equipment 42. The example illustrated here is a 150 G FlexE client carried over two 75 G wavelengths, but one can imagine a possible future 200 GbE rate where one would want to carry a 300 G FlexE client over two bonded 200 GbE and be able to carry the two partially-filled Ethernet PHYs over 150 G wavelengths.

FlexE Group

The FlexE group 12 includes from 1 to n 100GBASE-R Ethernet PHYs 22. Each PHY can be identified by a number in the range [1-254]. The values of 0 and 255 are reserved. A PHY number may correspond to the physical port ordering on equipment, but the FlexE shim 16 at each end of the group must identify each PHY in the group 12 using the same PHY number. PHY numbers do not need to be contiguous: even if a FlexE group 12 is composed of initially contiguous PHY numbers, this may not be preserved as PHYs are added to or removed from the group 12.

Each of these PHYs 22 uses the bulk of the PCS functions described in IEEE Std 802.3-2015 clause 82 including PCS lane distribution, lane marker insertion, alignment, and deskew. All the PHYs 22 of the FlexE group 12 must use the same physical layer clock. Each PHY 22 of the FlexE group 12 is able to deliver a logically serial stream of 64 b/66 b encoded blocks from the FlexE mux to the FlexE demux at a data rate of:

$$103.125 \text{ Gb/s} \times \frac{16383}{16384} \pm 100 \text{ ppm}$$

FlexE supports a value of n (number of PHYs 22 in the FlexE group 12) up to 254, although practical implementations are likely limited to the range of 4-8 PHYs 22. The fraction applied to the base rate reflects the fact that 1/16K of the space of the interface is occupied by PCS lane alignment markers which are not space available to carry the FlexE payload. The FlexE payload carried over each PHY 22 of the FlexE group 12 has the format of a logically serial stream of (mostly) legal 64 b/66 b blocks with the format described in IEEE Std 802.3-2015 Figure 82-4, although the blocks do not appear in a sequence that makes sense to interpret as an Ethernet interface. The actual PHYs 22 of the FlexE group 12 may transcode these blocks to 256 b/257 b format according to IEEE Std 802.3-2015 clause 91.5.2.5 according to the PHY type, but they are trans-decoded back to 64 b/66 b blocks prior to delivery to the FlexE demux.

FlexE Client

Each FlexE client 14 is a logically serial stream of 64 b/66 b blocks representing an Ethernet MAC layer. The MAC layer of a FlexE client 14 may operate at a rate of 10, 40, or n×25 Gb/s. The 64 b/66 b encoding is according to IEEE Std 802.3-2015 Figure 82-4. For certain cases where the FlexE client 14 originates from an Ethernet PHY, this may require conversion from the 4-byte alignment of start-of-packet for a PHY which uses the clause-49 PCS to the 8-byte alignment of Figure 82-4 as part of the idle insertion/deletion process.

In the case where the FlexE client 14 comes from an Ethernet PHY which uses PCS lane alignment markers (e.g., 40GBASE-R), the lanes must be deskewed, re-interleaved and serialized, removing the alignment markers to produce the 64 b/66 b stream which is treated as a FlexE client 14. All FlexE clients 14 transmitted over the same FlexE group 12 must be aligned to a common clock. This is accomplished using idle insertion/deletion as described in IEEE Std 802.3-2015 clause 82.2.3.6. In addition, the bit-rate of each FlexE client 14 is reduced slightly from nominal as part of this process to allow room for insertion of FlexE overhead and the PCS lane alignment markers of the FlexE group 12. So the 64 b/66 b encoded format of a FlexE client 14 operates at a data rate of:

$$\text{FlexE Client } MAC \text{ rate} \times \frac{66}{64} \times \frac{16383}{16384} \times \frac{20460}{20461} \pm 100 \text{ ppm}$$

This is a rate reduction slightly under 0.011%, which is well within what can be accomplished with idle insertion/deletion without packet loss. Note that this does not actually correspond to any clock that needs to be generated in an implementation, as the idle insertion-deletion process will simply operate by filling the allocated block positions in the FlexE group 12 from a FlexE client 14 First-In First-Out (FIFO) with its own deficit idle counter and inserting or deleting idles in the process of filling the block positions in the FlexE group 12 according to a FlexE calendar.

FlexE Calendar

The FlexE operates using a calendar which assigns 66 b block positions on each PHY 22 of the FlexE group 12 to each of the FlexE clients 14. The calendar has a granularity of 5 G and has a length of 20 slots per 100 G of FlexE group 12 capacity. Two calendars are supported: an "A" and a "B" calendar. At any given time, one of the calendars is used for mapping the FlexE clients 14 into the FlexE group 12 and demapping the FlexE clients 14 from the FlexE group 12. The two calendars are provided to facilitate reconfiguration.

Figure 6:
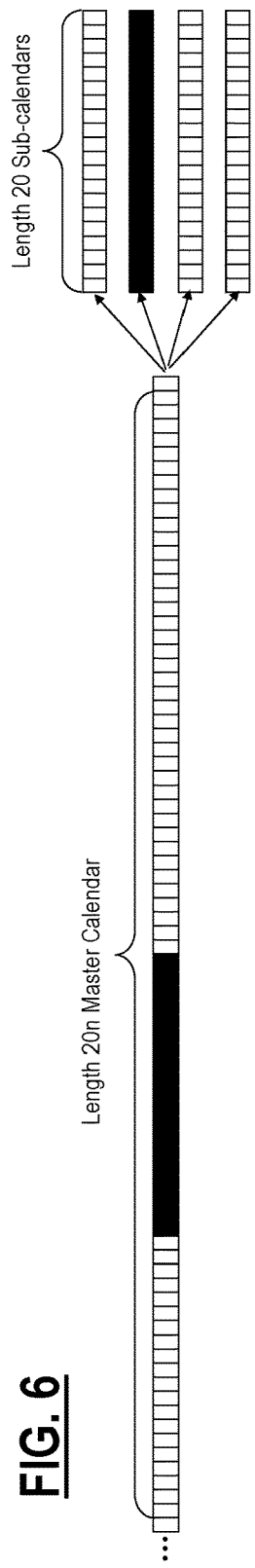
FIG. 6 is a diagram of FlexE calendar distribution.

For a FlexE group 12 including n bonded 100GBASE-R PHYs, the logical length of the master calendar is 20n. The blocks as allocated per the master calendar are distributed to n sub-calendars of length 20 on each of the PHYs of the FlexE group as shown in FIG. 6. FIG. 6 is a diagram illustrating FlexE calendar distribution. The order of distribution of twenty blocks at a time is selected over simple "round robin" distribution of 66 b blocks to facilitate addition of PHYs 22 to a FlexE group 12 without the need to change the calendar slots allocated to existing FlexE clients 14. Calendar slots are identified by their PHY number and the slot [0-19] (within that PHY). The calendar slots assigned to FlexE clients 14 do not change when PHYs are added or removed from the group 12. PHYs with calendar slots assigned to FlexE clients 14 cannot be removed from the group (or all FlexE clients 14 need to be moved to other PHYs or removed BEFORE a PHY is removed from the group). The "logical" sequence number of a calendar slot is 20× the PHY number plus the calendar slot number within the PHY. The sequence is ascending order. Note that the sequence numbering is not necessarily consecutive when the assigned PHY numbers are not contiguous. This logical order only matters when calendar slots on different PHYs are assigned to the same FlexE client 14.

FlexE Overhead and Alignment

Figure 7:
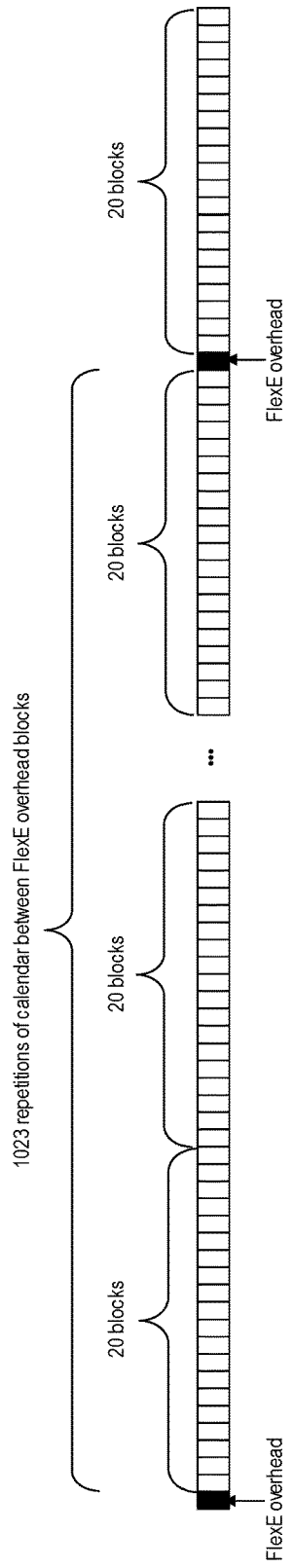
FIG. 7 is a diagram of FlexE overhead on each PHY of the FlexE group.

The alignment of the data from the PHYs 22 of the FlexE group 12 is accomplished by the insertion of FlexE overhead into a stream of 66 b blocks carried over the FlexE group 12. The FlexE overhead is encoded as a 66 b block which can be recognized independently of the FlexE client data. An illustration of the FlexE overhead on each PHY of the FlexE group is shown in FIG. 7.

On a 100GBASE-R PHY, a FlexE overhead block will occur approximately once per 13.1 µs. The actual format of the FlexE overhead blocks is such that they occur in a repeating sequence of four blocks, so the sequence has a period of approximately 52.4 s. This sequence is used to align all of the PHYs 22 of the FlexE group 12 at the FlexE demux to reconstruct the sequence in the order of the master calendar so that the FlexE clients 14 can be recovered.

Figure 8:
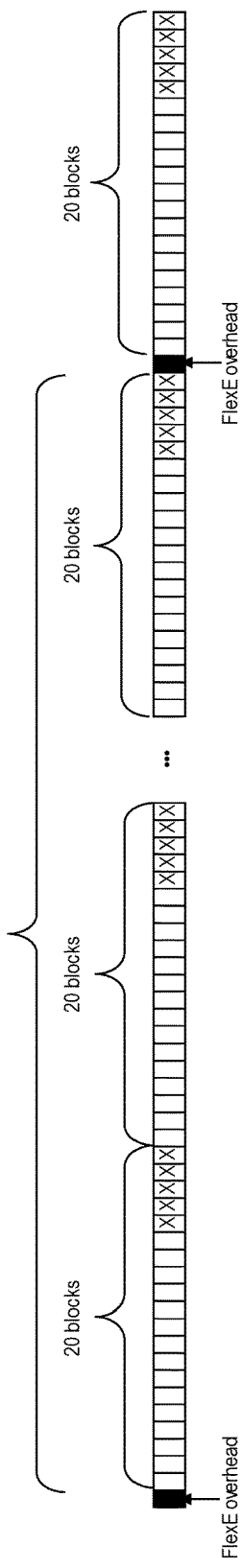
FIG. 8 is an example diagram of FlexE calendar slots where 25% of the calendar slots are unavailable.

The scenario illustrated in FIG. 5 is supported by marking a certain number of the calendar slots as unavailable. This is different from "unused," in that it is known, due to transport network constraints, that not all of the calendar slots generated from the FlexE mux will reach the FlexE demux and, therefore, no FlexE client 14 should be assigned to those slots. The intention is that when a PHY 22 of the FlexE group 12 is carried across the transport network, the mapping is able to compress the signal to less than the PHY rate by dropping the unavailable calendar slots. A case where 25% of the calendar slots are unavailable is illustrated in FIG. 8.

Figure 9:
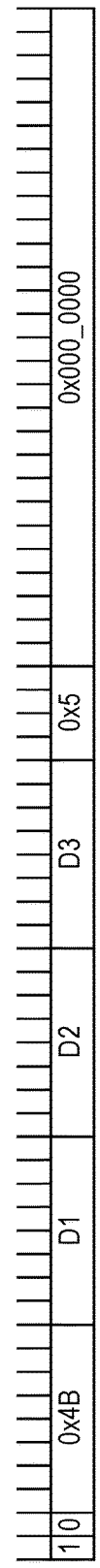
FIG. 9 is a diagram of encoding of ordered set block for FlexE overhead.

The anchor position FlexE overhead is encoded as an ordered set (control block type 0x4B). A different "O" code (Operational Code) is selected (i.e. 0x5) which is different from that for the sequence ordered set used by Ethernet or the signal ordered set used by Fibre channel. The information to be transmitted in the FlexE overhead is encoded into the bytes D1, D2, and D3 of the overhead set block is shown in FIG. 9.

The information which needs to be included in the overhead includes:
  The number of PHYs 22 in the FlexE group 12;
  The identity (sequence) of this PHY 22 within the FlexE group 12;
  A way to transmit the programming of the calendars from the FlexE mux to the FlexE demux;
  A way to indicate which calendar ("A" or "B") is in use at this time; and
  A management channel. This may not be necessary in all applications (for example, if a network management system has direct access to the FlexE shim 15 at both ends of the connection), but may be useful for applications such as using FlexE for an n×100 G umbilicus to a remote shelf of lower-rate ports.

Figure 10:
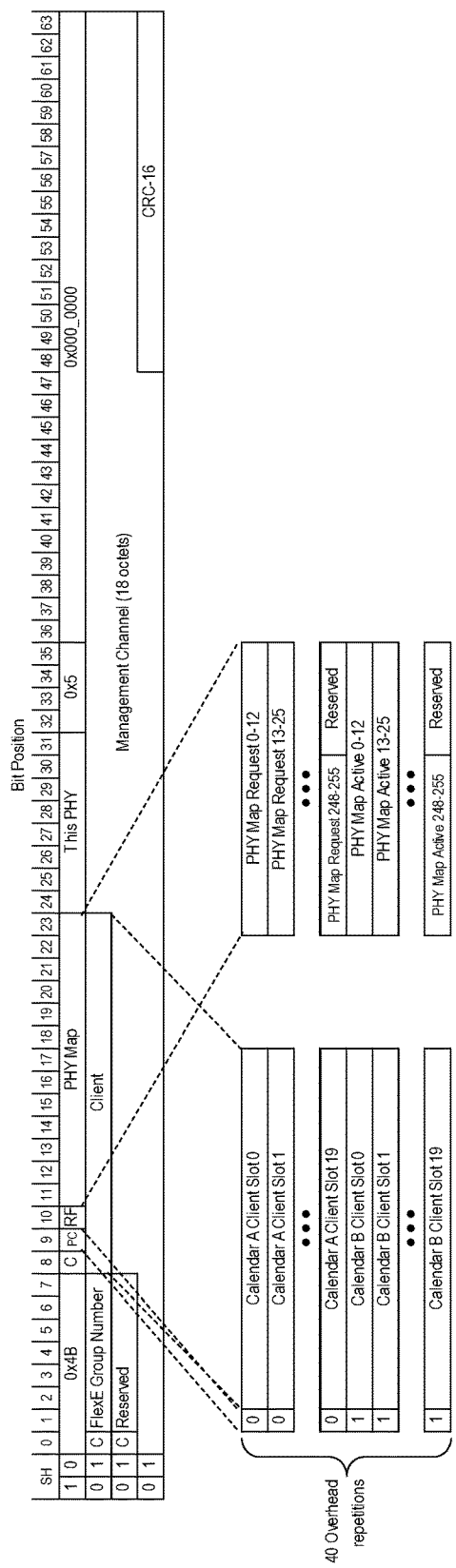
FIG. 10 is a diagram of FlexE overhead.

The amount of information to be conveyed from the FlexE mux to the FlexE demux exceeds the 24 bits available. This is addressed by spreading the relevant overhead across a sequence of four FlexE overhead blocks, each separated by 20×1023 FlexE data blocks. The encoding of the information in the sequence of four FlexE overhead blocks is illustrated in FIG. 10. The meaning, interpretation, and processing of this overhead are explained in clause 7 of Contribution Number: oif2015.127.01. The first of each sequence of four FlexE overhead blocks is encoded as an ordered set as shown in FIG. 9. The next three FlexE overhead blocks are encoded as data 66 b blocks at known locations based on the position of the ordered set block. The block with the higher order 2 bits of D1=00 serves as a marker to be used for alignment and re-interleaving of the sub-calendars from each of the PHYs 22 of the FlexE group 12 at the FlexE demux. The full sequence repeats once per approximately 52.4 µs. Subject to the amount of buffer provided in a given implementation, skew detection and compensation across the PHYs 22 of the FlexE group 12 can be compensated up to a bit less than half of this amount.

FlexE Group Functions

The FlexE group 12 includes from 1 to n 100GBASE-R PHYs 22. Each 100GBASE-R PHY 22 reuses nearly all of the functions as described for 100GBASE-R in IEEE Std 802.3-2015. This includes a subset of the functions of the PCS as described in clause 82, and all of the functions from sub-layers below the PCS as described in clauses 83, 86, 88, and 91-95 as appropriate according to the PHY type.

The FlexE shim 16 provides to each FlexE group PHY 22 a set of 64 b/66 b encoded blocks that are encoded according to Figure 82-4 in IEEE Std 802.3-2015. Within the PCS, clause 82, each FlexE group PHY reuses (with reference to Figure 82-2 in IEEE Std 802.3-2015) in the transmit direction, the scrambler, block distribution, and alignment insertion processes. In the receive direction, each FlexE group PHY reuses the lane block sync, alignment lock, and lane deskew (including Bit Error Rate (BER) monitor), lane reorder, alignment removal, and descrambling.

FlexE Clients

The format and standard bit rate of FlexE client 14 are described in clause 6.2 in IEEE Std 802.3-2015. However, FlexE also introduced the concept of flexible non-standard rates such as n×25 G (i.e. 175 G, 225 G, 300 G . . . ). FlexE clients 14 generally originate from one of the following sources. A FlexE client 14 may be generated internally within a system, for example from a Network Processing Unit (NPU) within a router or the like. The packet flow is generated at the determined FlexE client 14 MAC rate and 64 b/66 b encoded according to IEEE Std 802.3-2015 Figure 82-4.

FlexE clients 14 at the rates of 10 G, 40 G, 100 G, and in the future 25 G and 400 G can be created from an Ethernet PHY 22 at the corresponding rate with some processing to convert to the FlexE client 14 format and rate.

A 10GBASE-R signal will be converted to a 10 G FlexE client signal format before presenting to a FlexE mux by using the idle insertion/deletion process as described in IEEE Std 802.3-2015 clause 82.2.3.6 (which will actually be doing idle deletion) to adapt the signal to the 10 G FlexE client rate and align start of packet to an 8-byte boundary, encoding according to the 66 b block format of Figure 82-4 in IEEE Std 802.3-2015 from the received format which uses the blocks according to Figure 49-7 in IEEE Std 802.3-2015. A 10 G FlexE client signal coming from a FlexE demux can be converted to a 10GBASE-R signal format by using the idle insertion/deletion process as described in IEEE Std 802.3-2015 clause 49.2.4.7 (which will actually be doing idle insertion to compensate for the space that had been occupied by FlexE group lane alignment markers and FlexE overhead), which also aligns to 4-byte boundaries, and encodes the blocks according to Figure 49-7 in IEEE Std 802.3-2015.

The 25GBASE-R specification is currently under development in the IEEE P802.3by project. While the specification has not been finalized, judging from currently adopted baselines, converting a 25GBASE-R signal to a 25 G FlexE client signal format is expected to involve correcting FEC errors (if FEC present), removing the FEC, removing the CWM (if present), trans-decoding to 64 b/66 b, and using the idle insertion/deletion process as described in IEEE Std 802.3-2015 clause 82.2.3.6 (which will actually be doing idle deletion to make room for the FlexE overhead) to adapt the signal to the 25 G FlexE client rate and align start of packet to an 8-byte boundary, encoding according to the 66 b block format of Figure 82-4 in IEEE Std 802.3-2015 from the received format which uses the blocks according to Figure 49-7 of the same standard. The conversion of a 25 G FlexE client signal coming from a FlexE demux to a 25GBASE-R signal is expected to involve using the idle insertion/deletion process as described in IEEE Std 802.3-2015 clause 49.2.4.7 (which will actually be doing idle insertion to compensate for the space that had been occupied by FlexE overhead—the FlexE group lane alignment markers take the same proportion of the space as the CWM), 256 b/257 b transcoding, insertion of the CWM, and calculation and insertion of FEC, if appropriate.

A 40GBASE-R signal can be converted to a FlexE client 14 by serializing and deskewing the PCS lanes, removing the PCS lane alignment markers, and using the idle insertion/deletion process as described in IEEE Std 802.3-2015 clause 82.2.3.6 (which will actually be doing idle deletion to make room for the FlexE overhead) to adapt the signal to the 40 G FlexE client rate. A 40 G FlexE client 14 coming from a FlexE demux is converted to a 40GBASE-R interface by using the idle insertion/deletion process as described in IEEE Std 802.3-2015 clause 82.2.3.6 (which in this direction is generally doing idle insertion to restore the nominal bit-rate after removal of FlexE overhead), distributing the blocks round-robin to the four PCS lanes, and inserting PCS lane alignment markers.

A 100GBASE-R signal without FEC can be converted to and from a FlexE client 14 in the same manner as 40GBASE-R described above (except that the number of PCS lanes is 20 rather than 4). A 100GBASE-R signal with FEC, in converting to a FlexE client 14, also will correct any errors per the FEC code, remove the FEC, and trans-decode from 256 b/257 b prior to the idle insertion/deletion process. To convert a 100 G FlexE client 14 coming from a FlexE demux to a 100GBASE-R signal with FEC involves the same processes as for 40GBASE-R, but in addition, transcoding the signal to 256 b/257 b, inserting the FEC lane alignment markers, and adding the FEC.

400GBASE-R is currently under development in the P802.3bs task force. This standard is not complete, but the process of converting to and from a 400 G FlexE client 14 is expected to be similar to that for converting a 100GBASE-R client with FEC to and from a 100 G FlexE client 14.

A FlexE client might come from another FlexE shim. In the case of transport network equipment which implements the FlexE shim 16, FlexE clients 14 can be delivered from the FlexE shim 16 at the transport network ingress to another FlexE shim at the transport network egress. The FlexE flow as a sequence of 64 b/66 b encoded blocks is expected to be carried over the transport network without packet loss. As no timing information is carried by this stream, idle insertion or padding is possible in the mapping over the transport network. The FlexE shim 16 at the network egress will only need to perform idle insertion/deletion according to IEEE Std 802.3-2015 clause 82.2.3.6, not due to any expected change in the nominal bit-rate, but simply to align the clock with that of the other FlexE clients 14 for the same shim.

FlexE Overhead

The format of the FlexE overhead is indicated in FIG. 10. The FlexE overhead is encoded as a 66 b block and is inserted on each PHY 22 of the FlexE group 12. One overhead block is inserted after every 1023 iterations of the length 20 calendar of FlexE data blocks, so the sequence is one block of overhead followed by 1023×20 blocks of data followed by one block of overhead.

A FlexE overhead lock is achieved at the receiver (FlexE demux) by recognizing the FlexE "O" code used to send the first of every four FlexE overhead blocks, so the sync header is 10, the control block type is 0x4B (ordered set), and the "O" code is 0x5. Once FlexE overhead lock is achieved, the next expected FlexE overhead will be 1023×20+1 block positions later. While in FlexE overhead lock, bytes D1-D3 of the ordered set block, plus the data blocks occurring at 66 B block positions 20461, 40922, and 122766 blocks beyond the ordered set block will be interpreted as FlexE overhead multiframe. FlexE overhead is not interpreted if not in FlexE overhead lock. FlexE overhead lock will be lost if the sync header, control block type, or O code do not match at the expected position for 5 occurrences.

Calendar

There are two calendars for each PHY 22 of the FlexE group 12: the "A" calendar (encoded as 0) and the "B" calendar (encoded as one). The two calendars are used to facilitate hitless reconfiguration. Normally, changes are only made to the calendar which is not currently in use. Exceptions would include initial link configuration or replacement of a failed circuit pack where it is necessary to download the calendar information into the replacement pack.

The calendar in use is signaled from the FlexE mux to the FlexE demux in bit position 2 of the first three of the four codewords in the FlexE multiframe sequence. While most of the FlexE overhead can be reliably protected by the Cyclic Redundancy Check (CRC), the calendar in use must be interpreted even if the CRC is bad, since the FlexE demux must switch its calendar in use at precisely the same multiframe boundary as the FlexE mux. So that this can be done reliably, three copies of the calendar in use are transmitted and interpreted by the receiver by majority vote. Since the three copies are separated into different FlexE overhead blocks across the multiframe (1,351,704 bits apart from each other), the different copies will never be affected by the same burst error. Since each PHY should have a BER of $10^{-12}$ or better, the probability of two instances of the calendar in use being wrong is no more than $10^{-24}$, which can safely be ignored.

When the calendar in use changes from a 0 to a 1, or from a 1 to a zero, the calendar used by both the FlexE mux and the FlexE demux will be changed beginning with the first FlexE data block of the next FlexE overhead ordered set block.

The set of PHYs 22 in the FlexE group 12 (not necessarily consecutive) are indicated in the "PHY Map Active" portion of the PHY Map field of the FlexE overhead, distributed over the same group of forty sets of four blocks of FlexE overhead as are used to transmit the contents of the two calendars as described herein. The identity of this PHY 22 in the FlexE group (from 1 to n) is encoded in the D3 byte of the FlexE overhead ordered set block. Note that this is persistent information which does not change frequently. The receiver accepts a value for "This PHY" when seen identically for the second time in frames with a good CRC, and updates to the PHY map bit map are accepted from frames with good CRC. The "PHY Map Request" bits of the PHY map are used for a protocol for the addition and removal of PHYs from the FlexE server group as described herein.

The contents of both the A and B calendar are transmitted continuously from the FlexE mux to the FlexE demux, with one calendar slot being programmed in each multiframe of the FlexE overhead. The PC bit indicates which calendar (0=the "A" calendar and 1=the "B" calendar). All slots of the A calendar are programmed (20 muliframes, one for each slot), followed by all slots of the B calendar (20 multiframes). The PC bit will be equal to 0 for the twenty multiframes for programming of the "A" calendar, and equal to 1 for the twenty multiframes for programming of the "B" calendar. The receiver (FlexE demux) achieves calendar lock when the PC bit changes from 0 to 1 or from 1 to 0 in consecutive multiframes with a good CRC. The receiver loses calendar lock if the expected value of the PC bit is wrong in a multiframe with a good CRC.

The calendar is programmed in the same order as the calendar is in the frame from slots 0 to 19, starting with the first multiframe where PC=0 (or is expected to be zero while in calendar lock) for the A calendar and the first multiframe where PC=1 (or is expected to be 1 while in calendar lock) for the B calendar.

The Client field indicates which of the FlexE clients is mapped into a given calendar slot. The size of a given FlexE client can be calculated based on the number of calendar slots that client is assigned to. The Client is a 16-bit field transmitted in the $2^{nd}$ and $3^{rd}$ octets in the second "row" of the multiframe (the first data block after the ordered set). The value 0x000 indicates a calendar slot which is unused (but available). The value 0xFFFF (all ones) indicates a calendar slot which is unavailable, for the case indicated in FIG. 5 where the full FlexE group PHY rate cannot be carried over the transport network.

Calendar slot assignment changes are ignored while not in Calendar lock. Any change to which client is mapped into a calendar slot is ignored in a frame with a bad CRC. The full contents of both calendars are transmitted from the FlexE mux to the FlexE demux approximately once every 2 ms. The fact that the calendars are transmitted continuously avoids an inconsistency between the calendars at the FlexE mux and the FlexE demux due to a lost message.

The normal process of reconfiguration (e.g., adding new FlexE clients 14 to the FlexE group 12 or resizing a FlexE client 14) will involve programming the new configuration into the calendar which is not in use, then switching to the updated calendar, and finally updating the original calendar. The FlexE mux should wait for at least 3 cycles of transmission of the full calendar after the last update before switching the updated calendar to be the new calendar in use as described in clause 7.3.2 in IEEE Std 802.3-2015. This provides a vanishingly small probability that a calendar update has not been successfully received without requiring an Acknowledgment (ACK).

Management Channel

Certain applications may require the use of a management channel between the FlexE mux and the FlexE demux. The management channel may not be required for an application where a single management system or controller has access to the FlexE shims 16 on both ends of the FlexE group 12, but certain applications such as using FlexE for an n×100 G umbilicus to a remote shelf may use the management channel for communication with the controller in the remote shelf for configuration, alarming, software update, etc. When the management channel is not used, it is transmitted as zeros before scrambling The format of the management channel is not specified and is application specific. The management channel occupies 18 bytes of each FlexE overhead multiframe. The total capacity of the management channel is approximately 2.749 Mb/s.

Each PHY 22 of the FlexE group can carry its own management channel. The management channels are not aggregated across the FlexE group to keep open the possibility to pass back remote failure indications, for example, losing one of the PHYs 22 of the FlexE group 12. Most likely protocols that would be carried over this type of channel would be message oriented and would have some sort of frame check sequence on each packet, and therefore not require marking bytes of the management channel as bad if the CRC on the FlexE overhead is bad.

FlexE Group Number

For some applications, it may be desirable to be able to distinguish one FlexE group 12 from another: for example, an 8-port device which is capable of being provisioned as a single 8-port group or two 4-port groups may create a situation where the PHY numbers could overlap between different groups. For such a situation, a 7-bit FlexE group number is provided which allows for checking that the correct PHY 22 is being received from the correct group number. When this field is used, it must be provisioned to the same value in both directions. When a non-zero value is provisioned, the received group number will be checked against the provisioned group number, and any mismatch will be alarmed to indicate the misconnection.

Reserved Bits 18 bits per FlexE overhead multiframe are reserved for possible future extensions to this implementation agreement. The reserved bits shall be transmitted as zero before scrambling. An implementation could choose to treat the receipt of non-zero in the reserved bits in a multiframe with a good CRC as a minor alarm, as it could indicate interconnection with a future version of this implementation agreement that is not known to be interoperable. An implementation could also choose to ignore these bits on receipt and leave the responsibility to an implementation of a newer version of the implementation agreement to recognize receipt of zeros as an indication of interconnection with an older version, and presumably the newer version knows whether it is interoperable with the older version.

CRC-16

Primarily to avoid corrupting the content of the calendars in the presence of bit errors, the FlexE overhead is protected by a CRC. The CRC is calculated over the following bits across the four rows of the FlexE overhead multiframe (in the order transmitted and received, not the order described):

The D1, D2, and D3 bytes of the ordered set overhead block

All eight octets after the sync header of the $2^{nd}$ and $3^{rd}$ overhead data blocks The first six octets after the sync header of the $4^{th}$ overhead data block.

The CRC is calculated using the polynomial $x^{16}+x^{12}+x^5+1$. This value is inserted by the FlexE mux into the transmitted overhead. It is calculated by the FlexE demux over the same set of bits and compared to the received value. Various overhead described in the previous clauses is either accepted or ignored based on whether the CRC matches the expected value.

FlexE Mux Data Flow

The FlexE Mux creates a logically serial stream of 66 b blocks by interleaving FlexE client signals, according to a master calendar of length 20n slots for a FlexE group including n 100GBASE-R PHYs. Each slot corresponds to 5 G of bandwidth. A FlexE client is assigned a number of slots according to its bandwidth divided by 5 G. The master calendar is distributed as described earlier in FIG. 6.

Figure 11:
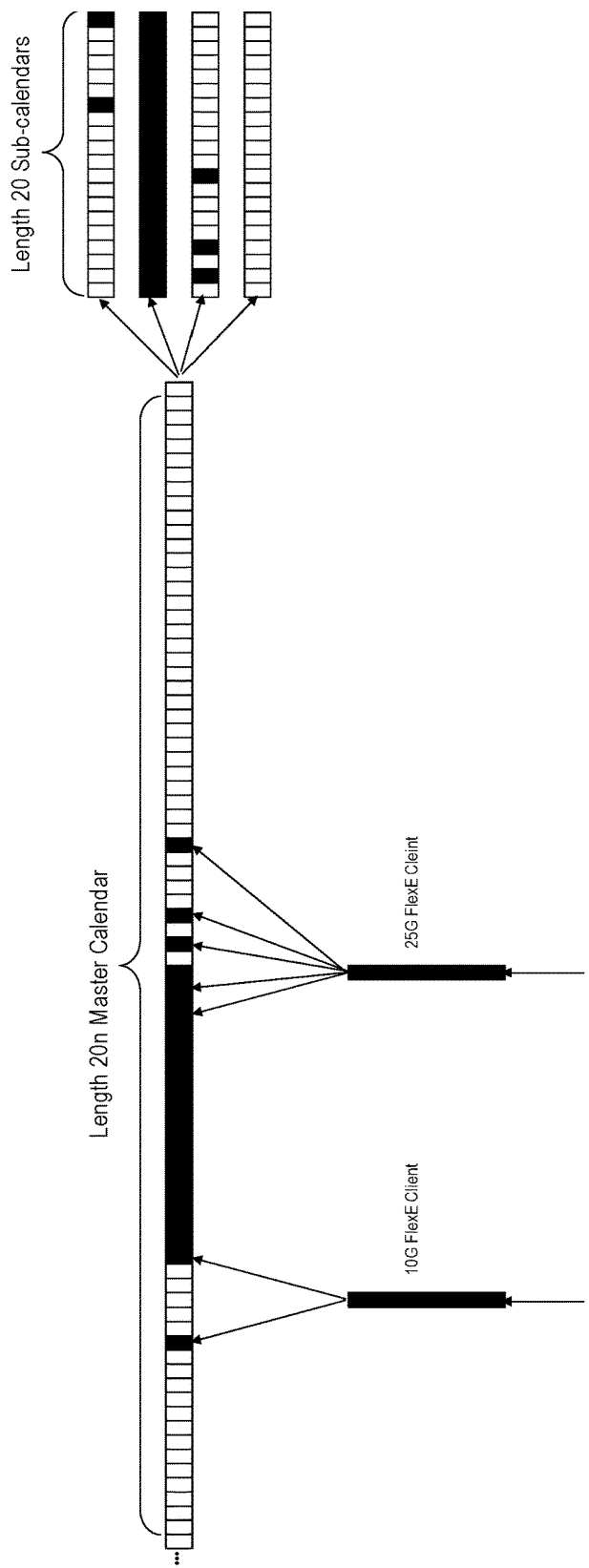
FIG. 11 is a diagram of data flow and interleaving for a FlexE client mux in calendar slots.

FIG. 11 presents an example of insertion of different bandwidth FlexE clients 14 into a logical master calendar. The slots assigned to a particular FlexE client 14 do not all need to be on the same PHY 22 of the FlexE group 12, and new clients 14 can be added as long as there are sufficient slots available. Any slot in the master calendar which is either "unassigned" or "unavailable" will be filled with Ethernet Error control blocks with the format given in FIG. 12. This ensures that any error in calendar slot assignment cannot appear to the FlexE demux as valid FlexE client data. Any incoming FlexE client 14 which has failed (e.g., one created from a physical Ethernet signal where the signal has failed, or failure to achieve block lock) will cause the slots assigned to that FlexE client 14 to be filled with Ethernet Local Fault ordered sets with the format as given in FIG. 13.

These rules allow for the creation of the complete data sequence on each PHY 22 of the FlexE group 12. The FlexE overhead is inserted onto each FlexE group PHY after every 1023 repetitions of the calendar sequence in the same relative position to the calendar sequence on every PHY 22. This provides a marker which allows the data from the different PHYs 22 of the FlexE group 12 to be re-interleaved in the original sequence so that the FlexE clients 14 can be extracted. The 66 b block stream is then converted into the format for the individual FlexE group PHY, which includes block distribution and alignment marker insertion, along with (if applicable) 256 b/257 b transcoding and FEC calculation and insertion.

FlexE Demux Data Flow

Figure 14:
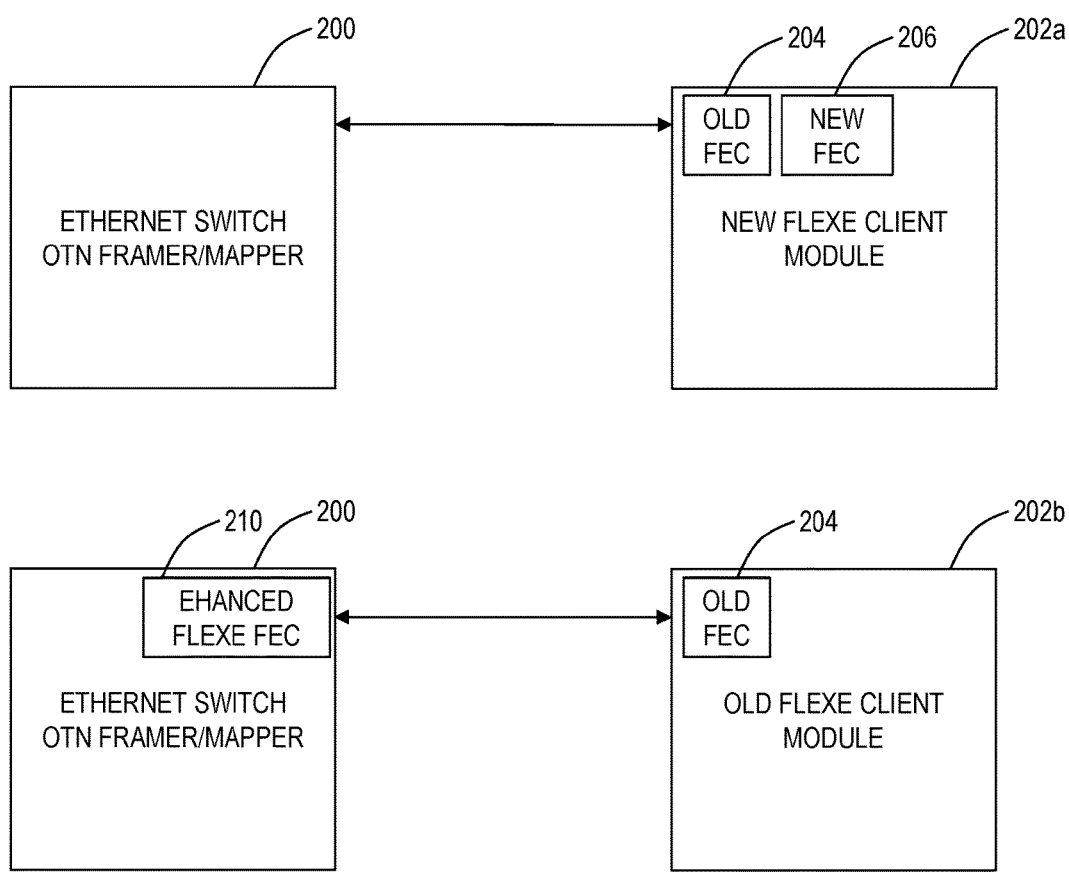
FIG. 14 is block diagrams of Ethernet switches connected to FlexE client modules.

The FlexE Demux operates on a sequence of 66b blocks received from each PHY 22 of the FlexE group 12. Recovering this sequence of blocks includes (if applicable), FEC error correction and FEC remove and trans-decoding to 64 b/66 b, PCS or FEC lane alignment, reinterleaving, and alignment marker removal. Once this has occurred, the PHYs 22 of the FlexE group 12 are re-interleaved so that FlexE clients 14 can be recovered as illustrated in FIG. 14. Note that the FlexE overhead multiframe repeats on a cycle of approximately 52.4 µs, which allows measuring skew differences between PHYs 22 of the FlexE group 12 of approximately ±25 µs.

FlexE Management

For FlexE group management, the control variables are the number of PHYs 22 in the FlexE group. The status variables are PHY_align—True if all PHYs in the FlexE group are being received and are within the skew tolerance of the implementation. False if one or more of the incoming PHYs has failed or if the inter-PHY skew exceeds the skew tolerance of the implementation.

For FlexE group management, per PHY, note that all 100GBASE-R control and status variables in or below the PCS are applicable to each PHY of the FlexE group 12.

Control Variables:
PHY number (within the FlexE Group)
Number of available Calendar Slots (20 except when entire PHY can't be carried across the transport network)
Mux_Calendar_A[0 . . . 19] and Mux_Calendar_B[0 . . . 19] The FlexE client that is mapped into each of the respective calendar slots in the transmit direction. The initial default for all calendar slots is UNUSED, except in the case where the number of available calendar slots is less than 20, in which case the first AVAILABLE number of slots default to UNUSED and the rest default to UNAVAILABLE.
Tx_Calender_in_use—Indicates whether the A or the B calendar is currently active.

Status Variables
Demux_Calendar_A[0 . . . 19] and Demux_Calendar_B [0 . . . 19] The FlexE client that the far end has mapped into each of the calendar slots in the received direction. The initial default for all calendar slots (prior to information received from the far end) is UNUSED, except in the case where the number of available calendar slots is less than 20, in which case the first AVAILABLE number of slots default to UNUSED and the rest default to UNAVAILABLE.
Rx_Calendar_in_use—Indicates the calendar being used at the current time by the far end.

Enhanced FlexE FEC

As described herein, FlexE, as defined in OIF, provides a Time Division Multiplexing (TDM) frame structure and splits the Ethernet PCS into 20×5 G "calendar slots." The Ethernet MAC is carried inside the FlexE TDM structure. These calendar slots are essentially TDM slots, and the 100 G interface is divided into 20 of these calendar slots. For FlexE, the purpose of the TDM frame structure is to allow bonding, channelization, and sub-rate applications. In various exemplary embodiments, the enhanced FEC described herein uses the TDM frame structure to separately allocate bandwidth to the client(s) and to one or more additional FEC slots.

Figure 12:
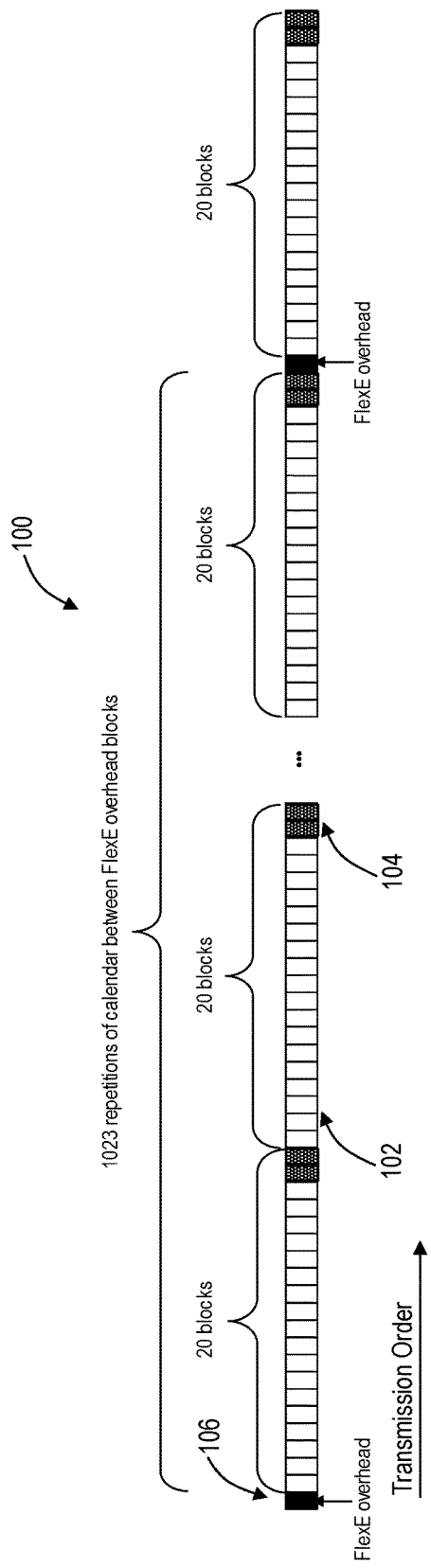
FIG. 12 is a block diagram of a FlexE Time Division Multiplexing (TDM) structure with calendar slots and with one or more calendar slots dedicated for FEC.

Referring to FIG. 12, in an exemplary embodiment, a block diagram illustrates a FlexE TDM structure 100 with calendar slots 102 and with one or more FEC calendar slots 104 dedicated for FEC. The FlexE TDM structure 100 in FIG. 12 is similar to FIGS. 6-8 with 20 calendar slots 102 and 1023 repetitions between the calendar slots 102 and FlexE overhead blocks 106. In the enhanced FEC, one or more of the calendar slots 102 are removed from use for Ethernet payload clients and used instead of FEC. Specifically, with the 20 calendar slots 102, N are dedicated to Ethernet payload clients and M are dedicated to FEC payload calculated over the FlexE TDM structure 100, N and M are integers and preferably N>M. In the example of FIG. 12, N=18 and M=2, thus the FlexE TDM structure 100 of FIG. 12 has 2/20 (10%) of the calendar slots 104 allocated to the FEC and 18/20 (90%) of the calendar slots 102 allocated to the Ethernet payload client(s). The FEC portion is 10% in this example, but could as easily be 5% (1 slot), 15% (3 slots), 20% (4 slots), and the like, based on application requirements.

Using one or more of the calendar slots 102 as the FEC calendar slots 104 removes a portion of bandwidth for the Ethernet payload clients from the FlexE TDM structure 100. Thus, the enhanced FEC herein contemplates two techniques to address this allocation of FEC bandwidth in the FEC calendar slots 104, namely to (1) keep the PHY consistent and reduce/subrate the Ethernet payload clients and (2) increase the PHY by the FEC percentage and then fit the same amount of the Ethernet payload clients into less allocated time slots.

For (1), in some packet applications, a reduction in the Ethernet payload client bandwidth might be acceptable to get slightly less throughput on the client packet rate but extend the reach. The rate adaptation could be performed using idle adaptation in normal FlexE fashion into the allocated slots. In the example of FIG. 12, this would result in a 90 G client, running on an enhanced FEC 100 G interface. This approach does not require any modifications or changes in any FlexE client hardware. The FEC size can be dynamic and communicated with the FlexE calendar and can also be changed with a calendar swap.

For (2), the calendar slots 102, 104 are increased in rate (per slot) given the PHY rate increase, but less of them are used, i.e., the N calendar slots 102 are only used for the Ethernet payload clients with N<20. In the example of FIG. 12, this would result in running the associated FlexE interface overclocked at about 10% (110 G), but then mapping 100 G of client packet rate into 18/20 calendar slots 102. Again, the rate adaptation is performed using idle adaptation in normal FlexE fashion. This approach requires overclocking/modifications on the FlexE client hardware.

The FEC is essentially only applied to the FlexE client(s) 14 (and also possibly/optionally the FlexE overhead 106), which is the stream of Ethernet 66 b blocks. FlexE is used to determine the FEC slot locations for the FEC calendar slots 104. FlexE logic is reused and unchanged; this can be viewed as a 2×FlexE client channelized approach with FEC taking up a client channel. That is, the underlying FEC processing can be performed by a host device using the FlexE client hardware, providing the enhanced FEC as a standardized approach to existing FlexE, i.e., the FEC is merely another client channel. However, this can apply to FlexE interfaces too, where multiple clients are protected by this new FEC.

Figure 13:
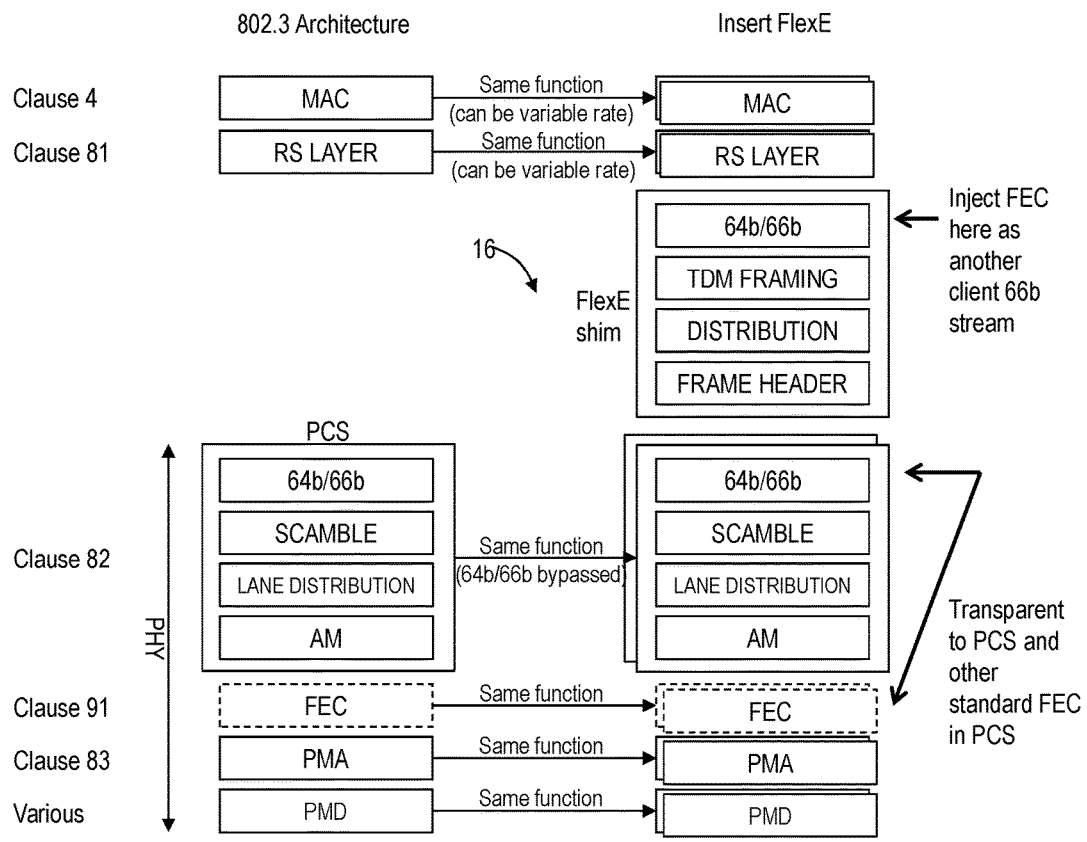
FIG. 13 is a logical diagram of the IEEE 802.3 stack and where the FlexE enhanced FEC is located therein.

FlexE is intended to be transparent to existing PHYs, PCS, PMD, and PMAs. The enhanced FEC herein is proposed to meet these intentions. The existing PHYs and modules would not be aware that it is carrying this FlexE FEC in scenario (1) above and could be overclocked and logically transparent in scenario (2). Referring to FIG. 13, in an exemplary embodiment, a logical diagram illustrates the IEEE 802.3 stack and where the enhanced FEC is located therein. Specifically, the enhanced FEC is injected at the 64 b/66 b in the FlexE shim 16 as another client 66 b stream, and the FEC calendar slots 104 are transparent to PCS and other standard FEC in the PCS.

In an exemplary embodiment, the FEC calendar slots 104 (also can be referred to as FEC blocks) can be accumulated X and used to process Ethernet payload client calendar slots 102 (also can be referred to as payload/client blocks) Y. The enhanced FEC contemplates any type of FEC scheme where X FEC/parity bits are used to process Y information bits. For example, the FEC scheme can include Reed-Solomon (RS) codes, BCH codes, Low-Density Parity-Check (LDPC) codes, or any other FEC scheme. Since the FlexE FEC scheme is transparent to the PCS, then nested FEC architectures could be applied where FlexE FEC is nested inside standard KR4/KP4 PCS FEC (100GE 802.3bj, bs, cd, . . . ). The FEC scheme could be chosen to complement the outside standard PCS FEC to implement two iterative FEC engines.

Although it is possible for FlexE FEC to be designed and implemented entirely separately from Ethernet FEC (802.3 clause 91 or similar), it is likely advantageous for the enhanced FEC to be aware of the higher FEC layer to ensure that its behavior does not interfere with FEC implemented in FlexE.

In the example of FIG. 12, a fixed number of the FlexE calendar slots 104 are allocated to FEC. However, this approach can be extended to include cases where a larger FEC codeword is desirable. So, for example, 5% FlexE FEC overhead (i.e., one calendar slot 104) could be implemented as repeating FlexE calendars all with 19 data blocks (calendar slots 102) and 1 FEC block (calendar slot 104), or by a calendar made up of 20 data blocks (calendar slots 102) followed by a calendar with 18 data blocks (calendar slots 102) and 2 FEC blocks (calendar slots 104). Other embodiments are also contemplated. Implementing a larger FEC block has advantages in burst tolerance as well as allowing a FEC frame to be distributed across multiple PMDs. Currently, calendars are distributed to PMDs in groups of 20 blocks, however, with the inclusion of FEC, the distribution algorithm may be modified to more evenly distribute errors, using the aforementioned approach.

The FEC information (i.e., parity bits) should be encoded using 66b data blocks (with a 01 header), and only be contained in the 64-bit portion of this block. This encoding is in order to keep transparency through the PCS.

As an example, a Reed-Solomon coding scheme could be used, operating on 8-bit symbols. For each calendar entry used for the FEC functionality 8 parity symbols would be used. Hence using M calendar entries (i.e., M calendar slots 104) for FEC could be implemented using a RS(165, (165–8*M), 8) coding. In this example, M=1 would result in a 4.7 dB coding gain at a post FEC BER of 1E-12; M=2 would result in a 6.2 dB coding gain at a post FEC BER of 1E-12. Other FEC schemes could be implemented to result in higher coding gain, burst tolerance, etc.

Also, the calendar slots 104 do not need to be contiguous to one another. For example, in FIG. 12, the FEC data in the calendar slots 104 are shown in calendar slots 19 and 20. These could be in any of the 20 calendar slots and not necessarily contiguous (adjacent) to one another. Again, the FEC data in the calendar slots 104 is merely data and could be in any of the calendar slots, specified by the calendar distribution. In some exemplary embodiments, the calendar slots 104 can be contiguous. In some exemplary embodiments, the calendar slots 104 can be non-contiguous such that each calendar slot 104 is contiguous with one of the calendar slots 102. In some exemplary embodiments, a sequence of calendar slots does not include the calendar slots 104, but only the calendar slots 102 while a subsequent sequence of the calendar slots includes both of the calendar slots 102, 104 (with the calendar slots 104 either contiguous or non-contiguous).

Referring to FIG. 14, in an exemplary embodiment, block diagrams illustrate Ethernet switches 200 connected to FlexE client modules 202a, 202b. The Ethernet switches 200 could also be Optical Transport Network (OTN) framers or mappers or any other network element/hardware supporting the FlexE client modules 202a, 202b. The FlexE client modules 202a, 202b are transceivers which facilitate transmission and reception of the FlexE TDM structure 200, such as optical transceivers. Currently, Ethernet interfaces are defined for error tolerance to $10^{-12}$. With the enhanced FEC, a significantly higher BER can be used while maintaining the same post-FEC performance. Note, there are approaches for framing at higher FEC in standards implementations. This is illustrated with reference to the FlexE client module 202a where the FlexE client module 202a is a new hardware module specific to a FEC standards implementation, such as standard FEC 204 and a new FEC 206 that is specific to the FEC standards implementation. However, one downside with this approach and the FlexE client module 202a is a new hardware module is required for each specific FEC standards implementation and application, leading to sparing and supply issues.

The operating principle of the enhanced FEC is that it uses standard interfaces/modules such as the FlexE client module 202*b*, that are transparent to FlexE, and all Ethernet modules 202*a*, 202*b* are transparent to FlexE. The modules 202*a*, 202*b* can be slightly overclocked and logically (data) transparent, or completely transparent (rate and data). The FlexE enhanced FEC approach utilizes the FlexE TDM structure 100 and basically embeds a new FEC layer (nested) only applicable to the Ethernet packet stream/client to improve overall net coding gain on the interface, thereby implementing a transparent approach from the perspective of the FlexE client modules 202*a*, 202*b*.

The enhanced FEC can be introduced at the device/component/ASIC such as through enhanced FlexE FEC circuitry 210 in the Ethernet switch 200. The enhanced FlexE FEC circuitry 210 includes electrical circuitry adapted to perform the enhanced FEC described herein. Thus, the enhanced FEC does not require a new module 202*a*, 202*b* with each implementation. This enhanced FEC capability is easier to integrate since it is nested into the 66 b stream through the PCS/PMD/PMA. That being said, this scheme does not prevent the FEC from being introduced in the module 202*a* and can work complementary to another standard FEC being introduced at the module 202*a*.

For example, IEEE is currently introducing a new KP4 FEC for PAM4 100GE (CAUI2) interfaces. This new 802.3cd FEC requires that it be implemented in the module 202*a* to accommodate the existing interface designs. However, this approach with the new FEC 206 is challenged by the power/area constraints of the module 202*a*. It is also less cost/power efficient than being integrated into the switch/framer ASIC/device, i.e., the enhanced FlexE FEC circuitry 210 in the Ethernet switch 200.

Existing approaches do not offer the option to sub-rate the client to offer a stronger FEC, they basically all overclock the PHY rate which has its own negative effects. KP4 FEC is being used for new Ethernet PMD's to provide approximately 6.6 dB coding gain. This coding gain is necessary to provide 10 km reach for ~50 Gb/s per lane optical interfaces or 2 km reach for ~100 Gb/s per lane optical interfaces. The enhanced FEC described herein offers a standards-transparent approach to provide additional coding gain.

Figure 15:
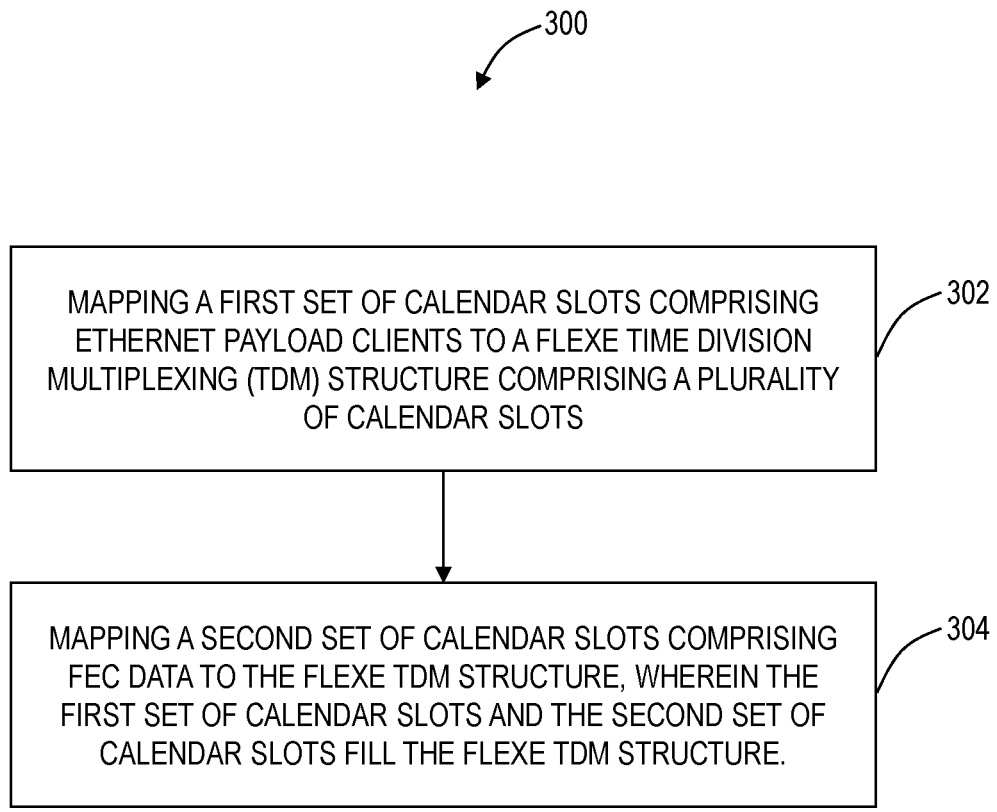
FIG. 15 is a flowchart of a Flexible Ethernet (FlexE) Forward Error Correction (FEC) process.

Referring to FIG. 15, in an exemplary embodiment, a flowchart illustrates a Flexible Ethernet (FlexE) Forward Error Correction (FEC) process 300. The process 300 includes mapping a first set of calendar slots including Ethernet payload clients to a FlexE Time Division Multiplexing (TDM) structure including a plurality of calendar slots (step 302); and mapping a second set of calendar slots including FEC data to the FlexE TDM structure, wherein the first set of calendar slots and the second set of calendar slots fill the FlexE TDM structure (step 304). In an exemplary embodiment, an overall Physical (PHY) rate of the FlexE TDM structure is kept constant with a reduction in bandwidth for the Ethernet payload clients based on the second set. In another exemplary embodiment, an overall Physical (PHY) rate of the FlexE TDM structure is increased based on the second set of calendar slots to support a set rate for the Ethernet payload clients with a reduced number of calendar slots. The FlexE TDM structure can include 20 calendar slots with the first set of calendar slots including N slots and the second set of calendar slots including M slots, N and M are integers and N>M.

The mapping steps 302, 304 can be performed in a corresponding switch independent of a FlexE client module which transmits and receives the FlexE TDM structure. The FEC data can be utilized iteratively with Physical Coding Sublayer (PCS) FEC at another layer. In an exemplary embodiment, each sequence of the plurality of calendar slots includes the first set of calendar slots and the second set of calendar slots. In another exemplary embodiment, one sequence of the plurality of calendar slots includes only the first set of calendar slots, and a subsequent sequence of the plurality of calendar slots includes both the first set of calendar slots and the second set of calendar slots.

In another exemplary embodiment, an apparatus for Flexible Ethernet (FlexE) Forward Error Correction (FEC) includes circuitry adapted to map a first set of calendar slots including Ethernet payload clients to a FlexE Time Division Multiplexing (TDM) structure including a plurality of calendar slots; and circuitry adapted to map a second set of calendar slots including FEC data to the FlexE TDM structure, wherein the first set of calendar slots and the second set of calendar slots fill the FlexE FlexE TDM structure.

In a further exemplary embodiment, a switch using Flexible Ethernet (FlexE) includes an interface to a FlexE client module adapted to transmit and receive a FlexE Time Division Multiplexing (TDM) structure; mapping circuitry communicatively coupled to the interface and adapted to map a first set of calendar slots including Ethernet payload clients to a FlexE Time Division Multiplexing (TDM) structure including a plurality of calendar slots, and map a second set of calendar slots including Forward Error Correction (FEC) data to the FlexE TDM structure, wherein the first set of calendar slots and the second set of calendar slots fill the FlexE FlexE TDM structure.

It will be appreciated that some exemplary embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the exemplary embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various exemplary embodiments.

Moreover, some exemplary embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various exemplary embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A Flexible Ethernet (FlexE) Forward Error Correction (FEC) method, the method comprising:
   mapping a first set of calendar slots comprising Ethernet payload clients to a FlexE Time Division Multiplexing (TDM) structure comprising a plurality of calendar slots which subdivide a FlexE interface;
   mapping a second set of calendar slots comprising FEC data to the FlexE TDM structure, wherein the first set of calendar slots and the second set of calendar slots fill the FlexE TDM structure, wherein the first set of calendar slots are N slots and the second set of calendar slots are M slots, N and M are integers, and N>M; and
   transmitting the FlexE TDM structure with both sets of calendar slots without requiring another protocol to transport the Ethernet payload clients.

2. The FlexE FEC method of claim 1, wherein an overall Physical (PHY) rate of the FlexE TDM structure is kept constant with a reduction in bandwidth for the Ethernet payload clients based on the second set.

3. The FlexE FEC method of claim 1, wherein an overall Physical (PHY) rate of the FlexE TDM structure is increased based on the second set of calendar slots, to support a set rate for the Ethernet payload clients with a reduced number of calendar slots.

4. The FlexE FEC method of claim 1, wherein the FlexE TDM structure comprises 20 calendar slots.

5. The FlexE FEC method of claim 1, wherein the mapping steps are performed in a corresponding switch or framer/mapper, independent of a FlexE client module which transmits and receives the FlexE TDM structure.

6. The FlexE FEC method of claim 1, wherein the FEC data is utilized iteratively with Physical Coding Sublayer (PCS) FEC at another layer.

7. The FlexE FEC method of claim 1, wherein each sequence of the plurality of calendar slots comprises the first set of calendar slots and the second set of calendar slots.

8. The FlexE FEC method of claim 1, wherein one sequence of the plurality of calendar slots comprises only the first set of calendar slots and a subsequent sequence of the plurality of calendar slots comprises both the first set of calendar slots and the second set of calendar slots.

9. The FlexE FEC method of claim 1, wherein the second set of calendar slots comprising the FEC data is communicated via a calendar and dynamically adjusted based thereon.

10. An apparatus for Flexible Ethernet (FlexE) Forward Error Correction (FEC), the apparatus comprising:
    circuitry adapted to map a first set of calendar slots comprising Ethernet payload clients to a FlexE Time Division Multiplexing (TDM) structure comprising a plurality of calendar slots which subdivide a FlexE interface;
    circuitry adapted to map a second set of calendar slots comprising FEC data to the FlexE TDM structure, wherein the first set of calendar slots and the second set of calendar slots fill the FlexE TDM structure, wherein the first set of calendar slots are N slots and the second set of calendar slots are M slots, N and M are integers, and N>M; and
    circuitry adapted to transmit the FlexE TDM structure with both sets of calendar slots transmitting the FlexE TDM structure with both sets of calendar slots without requiring another protocol to transport the Ethernet payload clients.

11. The apparatus of claim 10, wherein an overall Physical (PHY) rate of the FlexE TDM structure is kept constant with a reduction in bandwidth for the Ethernet payload clients based on the second set.

12. The apparatus of claim 10, wherein an overall Physical (PHY) rate of the FlexE TDM structure is increased based on the second set of calendar slots to support a set rate for the Ethernet payload clients with a reduced number of calendar slots.

13. The apparatus of claim 10, wherein the FlexE TDM structure comprises 20 calendar slots.

14. The apparatus of claim 10, wherein the apparatus is disposed in a corresponding switch or framer/mapper, independent of a FlexE client module which transmits and receives the FlexE TDM structure.

15. The apparatus of claim 10, wherein the FEC data is utilized iteratively with Physical Coding Sublayer (PCS) FEC at another layer.

16. The apparatus of claim 10, wherein each sequence of the plurality of calendar slots comprises the first set of calendar slots and the second set of calendar slots.

17. The apparatus of claim 10, wherein one sequence of the plurality of calendar slots comprises only the first set of calendar slots and a subsequent sequence of the plurality of calendar slots comprises both the first set of calendar slots and the second set of calendar slots.

18. A device comprising a switch or framer/mapper using Flexible Ethernet (FlexE), the device comprising:
    an interface to a FlexE client module adapted to transmit and receive a FlexE Time Division Multiplexing (TDM) structure; and
    mapping circuitry communicatively coupled to the interface and adapted to
       map a first set of calendar slots comprising Ethernet payload clients to a FlexE Time Division Multiplexing (TDM) structure comprising a plurality of calendar slots which subdivide a FlexE interface,
       map a second set of calendar slots comprising Forward Error Correction (FEC) data to the FlexE TDM structure, wherein the first set of calendar slots and the second set of calendar slots fill the FlexE TDM structure, wherein the first set of calendar slots are N slots and the second set of calendar slots are M slots, N and M are integers, and N>M; and
       transmit the FlexE TDM structure with both sets of calendar slots transmitting the FlexE TDM structure with both sets of calendar slots without requiring another protocol to transport the Ethernet payload clients.

19. The device of claim 18, wherein an overall Physical (PHY) rate of the FlexE TDM structure is kept constant with a reduction in bandwidth for the Ethernet payload clients based on the second set.

20. The device of claim 18, wherein an overall Physical (PHY) rate of the FlexE TDM structure is increased based on the second set of calendar slots to support a set rate for the Ethernet payload clients with a reduced number of calendar slots.

* * * * *